(12) United States Patent
Liu et al.

(10) Patent No.: US 12,205,927 B2
(45) Date of Patent: Jan. 21, 2025

(54) ARRAY SUBSTRATE AND METHOD FOR MANUFACTURING SAME, AND DISPLAY DEVICE

(71) Applicant: BOE TECHNOLOGY GROUP CO., LTD., Beijing (CN)

(72) Inventors: Chao Liu, Beijing (CN); Zhongbao Wu, Beijing (CN); Gongtao Zhang, Beijing (CN); Haiwei Sun, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 351 days.

(21) Appl. No.: 17/281,872

(22) PCT Filed: Feb. 21, 2020

(86) PCT No.: PCT/CN2020/076268
§ 371 (c)(1),
(2) Date: Mar. 31, 2021

(87) PCT Pub. No.: WO2021/088271
PCT Pub. Date: May 14, 2021

(65) Prior Publication Data
US 2021/0398955 A1   Dec. 23, 2021

(30) Foreign Application Priority Data
Nov. 8, 2019   (WO) ................ PCT/CN2019/116824

(51) Int. Cl.
*H01L 25/075* (2006.01)
*G06F 1/16* (2006.01)
(Continued)

(52) U.S. Cl.
CPC ........ *H01L 25/0753* (2013.01); *G06F 1/1647* (2013.01); *G06F 3/1423* (2013.01);
(Continued)

(58) Field of Classification Search
CPC .... G06F 3/1423; G06F 3/1446; G06F 1/1647; G09G 2300/026; H01L 25/0753;
(Continued)

(56) References Cited

U.S. PATENT DOCUMENTS 9,287,329 B1   3/2016  Lee et al.
11,468,832 B2  10/2022  Zhu et al.
(Continued)

FOREIGN PATENT DOCUMENTS

CN   104317080 A   1/2015
CN   106023811 A   10/2016
(Continued)

OTHER PUBLICATIONS

Non-final office Action of U.S. Appl. No. 17/896,270 issued on Jun. 7, 2023.
(Continued)

*Primary Examiner* — Feifei Yeung Lopez
(74) *Attorney, Agent, or Firm* — Lippes Mathias LLP

(57) ABSTRACT

An array substrate is provided. In the array substrate, an organic material layer includes a first planar portion, a bending portion and a second planar portion which are connected in sequence. The first planar portion and the second planar portion are disposed on both sides of a base substrate. A lead structure includes a first lead portion, a bent lead portion and a second lead portion which are connected in sequence, wherein the first lead portion is disposed outside the first plane portion, the bent lead portion is disposed outside the bending portion, and the second lead portion is disposed outside the second plane portion. An LED layer and a control circuit are respectively disposed on the both sides of the base substrates.

15 Claims, 21 Drawing Sheets

(51) Int. Cl.
  *G06F 3/14* (2006.01)
  *G09G 3/3225* (2016.01)
  *G09G 3/36* (2006.01)
  *H01L 27/12* (2006.01)
  *H01L 33/60* (2010.01)
  *H01L 33/62* (2010.01)
  *H10K 77/10* (2023.01)

(52) U.S. Cl.
  CPC ......... *G06F 3/1446* (2013.01); *G09G 3/3225* (2013.01); *G09G 3/3648* (2013.01); *H01L 27/1218* (2013.01); *H01L 27/1259* (2013.01); *H01L 33/60* (2013.01); *H01L 33/62* (2013.01); *H10K 77/111* (2023.02); *G09G 2300/026* (2013.01); *H01L 2933/0058* (2013.01); *H01L 2933/0066* (2013.01)

(58) Field of Classification Search
  CPC . H01L 27/1218; H01L 27/1259; H01L 33/60; H01L 33/62
  See application file for complete search history.

(56) References Cited

U.S. PATENT DOCUMENTS

| | | | |
|---|---|---|---|
| 2005/0122700 | A1 | 6/2005 | Kim et al. |
| 2015/0060931 | A1 | 3/2015 | Jung et al. |
| 2016/0105950 | A1* | 4/2016 | Drzaic ................ H05K 3/0014 156/196 |
| 2016/0293869 | A1 | 10/2016 | Saeki et al. |
| 2017/0062760 | A1 | 3/2017 | Kim |
| 2017/0117346 | A1 | 4/2017 | Kim |
| 2017/0148859 | A1 | 5/2017 | Nishinohara et al. |
| 2017/0301267 | A1 | 10/2017 | Cai |
| 2018/0083210 | A1 | 3/2018 | Choi et al. |
| 2018/0101200 | A1 | 4/2018 | Myeong et al. |
| 2018/0188579 | A1* | 7/2018 | Jeong ................ G02F 1/13452 |
| 2019/0025620 | A1 | 1/2019 | Tuan et al. |
| 2019/0051858 | A1* | 2/2019 | Tomioka ............. H10K 59/124 |
| 2019/0138258 | A1* | 5/2019 | Cope .................... G09F 9/3026 |
| 2019/0305073 | A1* | 10/2019 | Chen .................... H10K 59/121 |
| 2019/0372034 | A1* | 12/2019 | Kaneko ................ H10K 50/841 |
| 2020/0111978 | A1 | 4/2020 | Kim et al. |
| 2020/0119124 | A1* | 4/2020 | Ahn ...................... H05K 1/028 |
| 2020/0211941 | A1* | 7/2020 | Xi ...................... H01L 23/49811 |
| 2020/0271977 | A1 | 8/2020 | Chen et al. |
| 2020/0381386 | A1* | 12/2020 | Chae ....................... H01L 24/83 |
| 2021/0335971 | A1* | 10/2021 | Zhao .................... H10K 59/131 |

FOREIGN PATENT DOCUMENTS

| | | |
|---|---|---|
| CN | 106486520 A | 3/2017 |
| CN | 106611773 A | 5/2017 |
| CN | 106782091 A | 5/2017 |
| CN | 106992259 A | 7/2017 |
| CN | 106653777 A * | 10/2017 |
| CN | 107403590 A | 11/2017 |
| CN | 107871751 A | 4/2018 |
| CN | 107919062 A | 4/2018 |
| CN | 108681123 A | 10/2018 |
| CN | 108878483 A | 11/2018 |
| CN | 109285452 A | 1/2019 |
| CN | 109559639 A | 4/2019 |
| CN | 109559646 A | 4/2019 |
| CN | 109917953 A | 6/2019 |
| CN | 110164901 A | 8/2019 |
| CN | 110297346 A | 10/2019 |
| CN | 110308579 A | 10/2019 |
| CN | 110503898 A | 11/2019 |
| CN | 210072572 U | 2/2020 |
| JP | 2017069546 A | 4/2017 |
| KR | 20180079079 A | 7/2018 |

OTHER PUBLICATIONS

Notice of Reasons for Refusal of Japanese application No. 2021-568080 issued on Oct. 30, 2023.
First office Action of Vietnam's application No. 1-2021-07435 issued on Jan. 11, 2024.
Notice of Preliminary Rejection of Korean application No. 10-2021-7037151 issued on Sep. 27, 2024.

\* cited by examiner

| Forming an initial structure, wherein the initial structure includes a base substrate, an organic material layer, a lead structure, an LED layer, and a control circuit; the base substrate includes a first side and a second side opposite to each other, and a third side adjacent to the first side and the second side; the organic material layer, the lead structure, and the LED layer are all disposed on the first side of the base substrate, and are sequentially arranged in a direction away from the base substrate, and the control circuit and the LED layer are disposed on the same layer; an orthographic projection of the organic material layer on a plane where the base substrate is disposed is partially overlapped with an orthographic projection of the base substrate on the plane where the base substrate is disposed; and a side of the organic material layer distal from the base substrate is covered by the lead structure, and the lead structure is connected to the LED layer and the control circuit | 3501 |

↓

| Moving the control circuit from the first side of the base substrate to the second side of the base substrate by bending the organic material layer and the lead structure, wherein the bent organic material layer includes a first planar portion, a bending portion and a second planar portion which are connected in sequence; wherein the first planar portion is disposed on the first side of the base substrate, the second planar portion is disposed on the second side of the base substrate, and the bending portion is disposed on the third side; the bent lead structure includes a first lead portion, a bent lead portion, and a second lead portion which are connected in sequence, wherein the first lead portion is disposed on a side of the first planar portion distal from the base substrate and is connected to the LED layer, the bent lead portion is disposed on a side of the bending portion distal from the base substrate, and the second lead portion is disposed on a side of the second planar portion distal from the base substrate and is connected to the control circuit | 3502 |

FIG. 35

ARRAY SUBSTRATE AND METHOD FOR MANUFACTURING SAME, AND DISPLAY DEVICE

CROSS-REFERENCE TO RELATED APPLICATIONS

The present disclosure is a 371 of PCT Application No. PCT/CN2020/076268, filed Feb. 21, 2020, which claims priority to PCT Application No. PCT/CN2019/116824, filed on Nov. 8, 2019 and titled "ARRAY SUBSTRATE AND METHOD FOR MANUFACTURING SAME, DISPLAY PANEL AND DISPLAY DEVICE," the disclosure of which is incorporated herein by reference in its entirety.

TECHNICAL FIELD

The present disclosure relates to an array substrate and a method for manufacturing the same, and a display device.

BACKGROUND

With the development of a display technology, a light emitting diode (LED) display device in a splicing mode has been widely used. The display device includes a plurality of spliced LED array substrates and has a relatively large display area.

However, there is a relatively wide seam between every two adjacent LED array substrates among the plurality of spliced LED array substrates, which affects the display effect of the LED display device.

SUMMARY

The present disclosure relates to an array substrate and a method for manufacturing the same, and a display device. The technical solutions are summarized as follows.

In a first aspect, an array substrate is provided. The array substrate includes: a base substrate, an organic material layer, a lead structure, an LED layer, and a control circuit; wherein
  the base substrate includes a first side and a second side opposite to each other, and a third side adjacent to the first side and the second side;
  the organic material layer includes a first planar portion, a bending portion and a second planar portion which are connected in sequence, wherein the first planar portion is disposed on the first side, the second planar portion is disposed on the second side, and the bending portion is disposed on the third side;
  the lead structure includes a first lead portion, a bent lead portion and a second lead portion which are connected in sequence, wherein the first lead portion is disposed on a side of the first planar portion distal from the base substrate, the bent lead portion is disposed on a side of the bending portion distal from the base substrate, and the second lead portion is disposed on a side of the second planar portion distal from the base substrate;
  the LED layer is disposed on a side of the first lead portion distal from the base substrate, and is connected to the first lead portion; and
  the control circuit is disposed on the second side of the base substrate and is connected to the second lead portion, and the control circuit is configured to control the LED layer to emit light.

In some embodiments, a connection portion between the second side and the third side includes a chamfered structure.

In some embodiments, the array substrate satisfies at least one of the following conditions:

$b \geq 0.6a$; and $b < P/2$;

wherein the LED layer includes a plurality of LEDs; $2a$ represents a length of any one of the plurality of LEDs in an extension direction of the base substrate; $b$ represents a distance between the bending portion and an LED in the plurality of LEDs proximal to the bending portion; and a distance between centers of any two LEDs in the plurality of LEDs is P.

In some embodiments, a surface of the bent lead portion includes a recessed region.

In some embodiments, the array substrate further includes a first spacer structure disposed between the base substrate and the bending portion.

In some embodiments, the first spacer structure is adhesive.

In some embodiments, a surface of the first spacer structure distal from the base substrate includes an arc face.

In some embodiments, the arc face is a semicircular arc face; and in an arrangement direction of the base substrate and the first spacer structure, a maximum length of the first spacer structure is greater than a radius of the semicircular arc face.

In some embodiments, the surface of the first spacer structure distal from the base substrate includes n first arc faces, a plane and n second arc faces, which are connected in sequence, $n \geq 1$.

In some embodiments, $n=1$, and a radius of the first arc face is equal to a radius of the second arc face.

In some embodiments, $n>1$, the radii of the n first arc faces are different from each other; a radius of an $i^{th}$ first arc face is equal to a radius of an $(n-i+1)^{th}$ second arc face, $1 \leq i \leq n$.

In some embodiments, the array substrate further includes a second spacer structure disposed between the base substrate and the second planar portion, and the second spacer structure is connected to the first spacer structure.

In some embodiments, a side of the first spacer structure proximal to the second spacer structure is disposed on an extension plane of the third side, and a side of the second spacer structure proximal to the first spacer structure is disposed on an extension plane of the third side.

In some embodiments, the array substrate further includes a binding substrate disposed between the base substrate and the second planar portion.

In some embodiments, the base substrate is made of a same material as the binding substrate, and a thickness of the base substrate is the same as a thickness of the binding substrate.

In some embodiments, the array substrate further includes a light reflecting layer disposed between the base substrate and the first planar portion.

In some embodiments, a distance between the light reflecting layer and the bending portion is greater than 0.

In a second aspect, a method for manufacturing an array substrate is provided. The method is applicable to manufacturing the array substrate according to the first aspect. The method includes:
  forming an initial structure, wherein the initial structure includes a base substrate, an organic material layer, a lead structure, an LED layer, and a control circuit; wherein the base substrate includes a first side and a second side opposite to each other, and a third side adjacent to the first side and the second side; the organic material layer, the lead structure, and the LED layer are all disposed on the first side of the base substrate, and are sequentially arranged in a direction away from the base substrate, and the control circuit and the LED layer are disposed on the same layer; an orthographic projection of the organic material layer on a plane where the base substrate is disposed is partially overlapped with an orthographic projection of the base substrate on the plane where the base substrate is disposed; and the lead structure covers a side of the organic material layer distal from the base substrate, and is connected to the LED layer and the control circuit; and moving the control circuit from the first side of the base substrate to the second side of the base substrate by bending the organic material layer and the lead structure, wherein the bent organic material layer includes a first planar portion, a bending portion and a second planar portion which are connected in sequence; wherein the first planar portion is disposed on the first side of the base substrate, the second planar portion is disposed on the second side of the base substrate, and the bending portion is disposed on the third side; the bent lead structure includes a first lead portion, a bent lead portion, and a second lead portion which are connected in sequence, wherein the first lead portion is disposed on a side of the first planar portion distal from the base substrate and is connected to the LED layer, the bent lead portion is disposed on a side of the bending portion distal from the base substrate, and the second lead portion is disposed on a side of the second planar portion distal from the base substrate and is connected to the control circuit.

In some embodiments, forming the initial structure includes:

forming an initial substrate, the organic material layer, the lead structure, and the LED layer which are sequentially laminated, wherein an orthographic projection of the organic material layer on a plane where the initial substrate is disposed is within an orthographic projection of the initial substrate on the plane where the initial substrate is disposed; and a side of the organic material layer distal from the initial substrate is covered by the lead structure and the lead structure is connected to the LED layer;

connecting the control circuit to the lead structure on a side of the lead structure distal from the initial substrate; and obtaining the initial structure by removing a partial region from the initial substrate, wherein an orthographic projection of the partial region on the plane where the initial substrate is disposed is outside an orthographic projection of the LED layer on the plane where the initial substrate is disposed.

In some embodiments, the initial structure further includes a binding substrate which is spaced apart from the base substrate;

wherein two ends of the organic material layer are lapped on the base substrate and the binding substrate respectively; and after the organic material layer and the lead structure are bent, the binding substrate is disposed between the base substrate and the second planar portion.

In some embodiments, the initial structure further includes a light reflecting layer disposed between the base substrate and the organic material layer; and forming the initial structure further includes:

prior to forming the organic material layer on the initial substrate, forming the light reflecting layer on the initial substrate, wherein an orthographic projection of the light reflecting layer on the plane where the initial substrate is disposed is outside the orthographic projection of the partial region on the plane where the initial substrate is disposed; and removing the partial region from the initial substrate includes:

separating the partial region from the organic material layer by irradiating the initial substrate with laser from a side of the initial substrate distal from the light reflecting layer;

cutting the edge of the partial region on the initial substrate; and peeling off the partial region.

In some embodiments, forming the initial structure further includes:

prior to forming the organic material layer on the initial substrate, forming a dissociating layer on the initial substrate, wherein the orthographic projection of the partial region on the plane where the initial substrate is disposed is within an orthographic projection of the dissociating layer on the plane where the initial substrate is disposed; and adhesion between the dissociating layer and the organic material layer is less than adhesion between the initial substrate and the organic material layer; and removing the partial region from the initial substrate includes:

cutting the edge of the partial region on the initial substrate; and peeling off the partial region and a portion of the dissociating layer that covers the partial region.

In a third aspect, a display device is provided. The display device includes the array substrate according to the first aspect.

In some embodiments, the display device includes a plurality of array substrates which are spliced with each other.

In some embodiments, an LED layer in the array substrate includes a plurality of LEDs disposed on the first planar portion, and a distance between centers of any two LEDs in the plurality of LEDs is P; and in any two adjacent array substrates in the display device, the distance between the centers of the closest two LEDs is Q, and P=Q.

BRIEF DESCRIPTION OF THE DRAWINGS

FIG. 35 is a flowchart of a method for manufacturing an array substrate according to an embodiment of the present disclosure;

DETAILED DESCRIPTION

For clearer descriptions of the principles, technical solutions, and advantages of the present disclosure, the embodiments of the present disclosure are hereinafter described in detail with reference to the accompanying drawings.

In related arts, in an LED display device formed by splicing a plurality of LED array substrates, the border of each LED array substrate is relatively wide, such that a seam visible to the human eyes is formed in the LED display device, thereby affecting a display effect of the LED display device. An embodiment of the present disclosure provides an array substrate, which solves the problem of wide seams formed in the splicing of the LED display device at least by reducing the border width of each LED array substrate.

Figure 1:
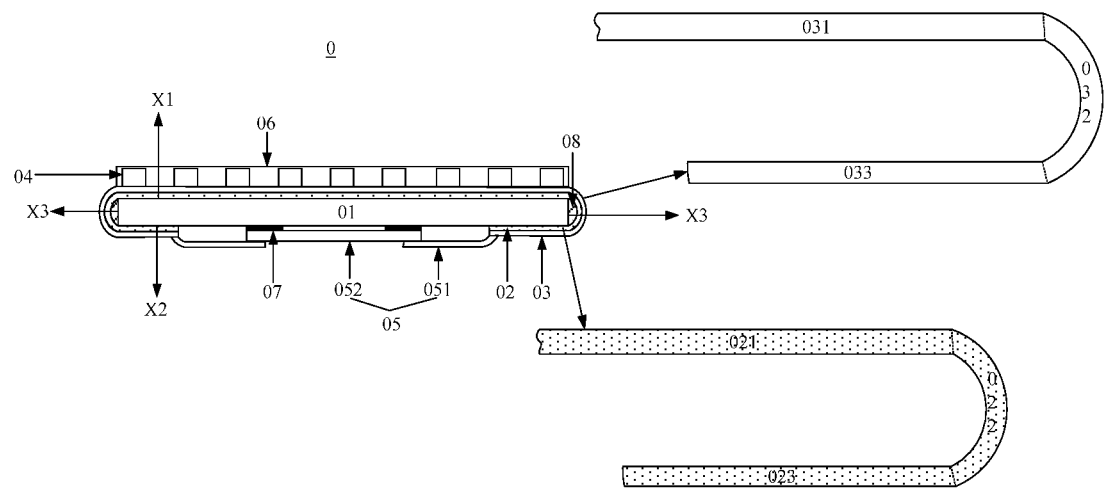
FIG. 1 is a schematic structural diagram of an array substrate according to an embodiment of the present disclosure.

FIG. 1 is a schematic structural diagram of an array substrate according to an embodiment of the present disclosure. As shown in FIG. 1, the array substrate 0 includes a base substrate 01, an organic material layer 02, a lead structure 03, an LED layer 04 and a control circuit 05.

The base substrate 01 includes a first side X1 and a second side X2 opposite to each other, and a third side X3 adjacent to the first side X1 and the second side X2.

The organic material layer 02 includes a first planar portion 021, a bending portion 022, and a second planar portion 023 which are connected in sequence. The first planar portion 021 is disposed on the first side X1 of the base substrate 01, the second planar portion 023 is disposed on the second side X2 of the base substrate 01, and the bending portion 022 is disposed on the third side X3.

The lead structure 03 includes a first lead portion 031, a bent lead portion 032, and a second lead portion 033 which are connected in sequence. The first lead portion 031 is disposed on a side of the first planar portion 021 distal from the base substrate 01, the bent lead portion 032 is disposed on a side of the bending portion 022 distal from the base substrate 01, and the second lead portion 033 is disposed on a side of the second planar portion 023 distal from the base substrate 01.

The LED layer 04 is disposed on a side of the first lead portion 031 distal from the base substrate 01, and is connected to the first lead portion 031.

The control circuit 05 is disposed on the second side X2 of the base substrate 01 and is connected to the second lead portion 033, and the control circuit 05 is configured to control the LED layer 04 to emit light.

In summary, in the array substrate provided by the present embodiment of the present disclosure, the organic material layer and the lead structure are both bent to the second side of the base substrate, such that the lead structure is bound with the control circuit on the other side (the second side) of the base substrate where the LED layer is disposed, instead of a side (the first side) where the LED layer is disposed. This avoids the problem of a relatively wide border of the array substrate caused by binding the lead structure with the control circuit on the side (the first side) where the LED layer is disposed. When a plurality of display substrates is spliced, a width of a seam between every two adjacent display substrates can be effectively reduced.

In some embodiments, a material of the base substrate 01 includes a rigid material (such as glass, and the like), or a flexible material with a certain strength (such as polyethylene terephthalate (PET)), or metal, and the like. In the embodiments of the present disclosure, when the base substrate 01 is made of a rigid material, the base substrate 01 is a rigid substrate.

Figure 2:
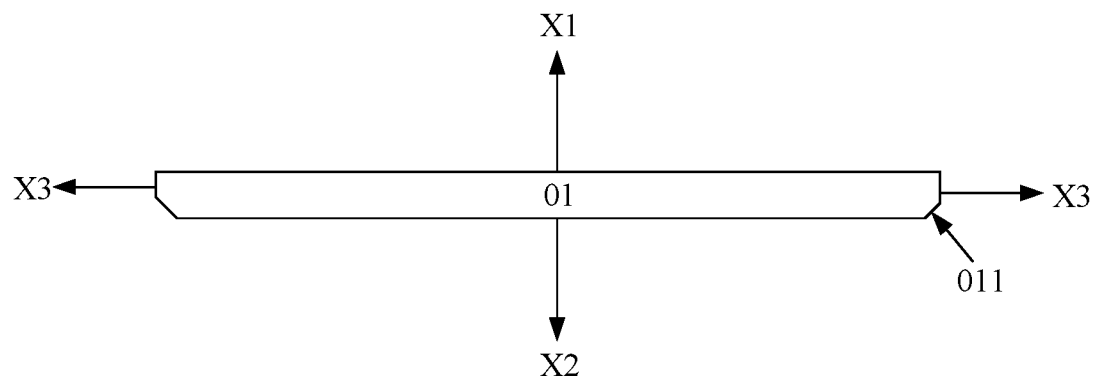
FIG. 2 is a schematic structural diagram of a base substrate according to an embodiment of the present disclosure.
Figure 3:
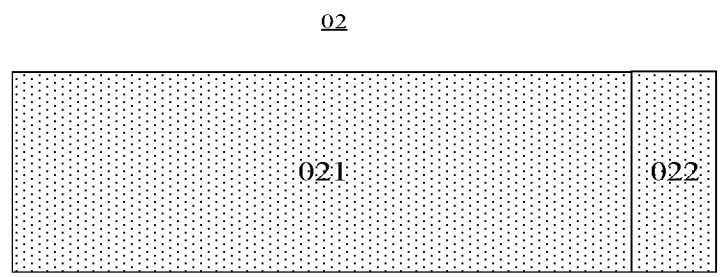
FIGS. 3 to 6 are schematic diagrams of different embodiments of a partial structure of an organic material layer according to an embodiment of the present disclosure.
Figure 4:
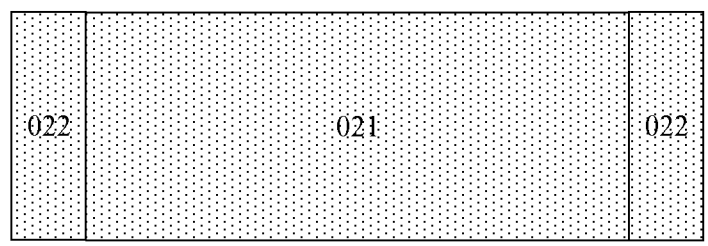
Figure 5:
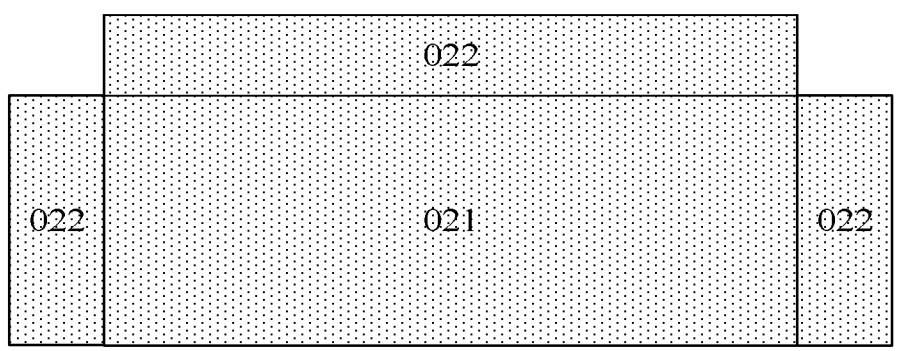
Figure 6:
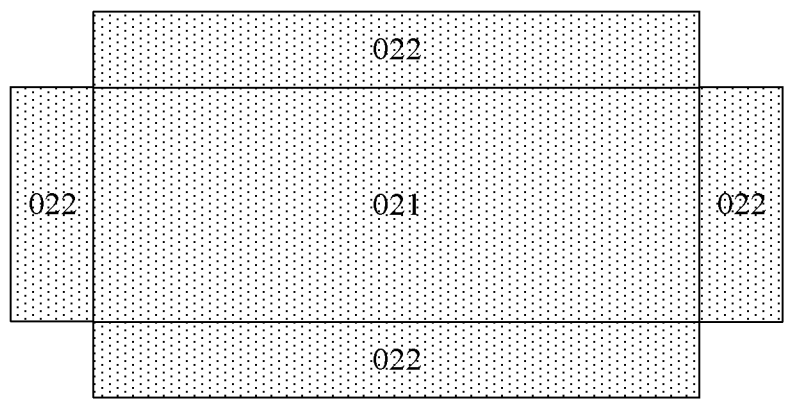

FIG. 2 is a schematic structural diagram of a base substrate according to an embodiment of the present disclosure. As shown in FIG. 2, based on FIG. 1, the base substrate 01 includes the third side X3 adjacent to the first side X1 and the second side X2. A connection portion between the surface of the second side X2 and the surface of the third side X3 may include a chamfered structure 011. In the presence of the chamfered structure 011, when the organic material layer 02 is bent from the first side X1 to the second side X2, the probability that the organic material layer 02 is damaged by a right angle of base substrate 01 can be reduced, thereby protecting the organic material layer 02.

The organic material layer 02 may be made of any flexible material, such as polyimide (PI), and the like. A thickness of the organic material layer 02 may be within [5 micrometers, 10 micrometers], or within other ranges (such as [2 micrometers, 11 micrometers]). The lead structure 03 may be made of any electrically conductive material, such as copper or iron, and the like.

It should be noted that, in any of the array substrates according to the embodiments of the present disclosure, the organic material layer 02 may include a first planar portion 021, m bending portions 022, and m second planar portions 023. When the base substrate 01 is in a shape of a polygon, m≥1. FIG. 1 is a schematic diagram of an embodiment with m=2; m>2, the m bending portions 022 are respectively disposed on different third sides X3 of the base substrate 01; and the m second planar portions 023 are all disposed on the second side X2 of the base substrate 01. The entire surface of the first planar portion 021 is on the first side X1 of the base substrate 01, and the first planar portion 021 is connected to an $i^{th}$ second planar portion 023 through an $i^{th}$ bending portion 022 to form an integrated structure, 1≤i≤m.

The lead structure 03 includes n first lead portions 031, n bent lead portions 032, and n second lead portions 033. The $j^{th}$ first lead portion 031 is connected to a $j^{th}$ lead portion 031 through a $j^{th}$ second lead portion 033, and $1 \leq j \leq n$. Then first lead portions 031 are all disposed on the first planar portion 021. The n bent lead portions 032 may all be disposed on the same bending portion 022, or may be grouped, and a plurality of bent lead portions 032 in each group which are the same or different in quantity are respectively disposed on a plurality of bending portions 022. The n second lead portions 031 may all be disposed on the same second planar portion 023, or may be grouped, and a plurality of second lead portions 031 in each group which are the same or different in quantity are respectively disposed on a plurality of second planar portions 023.

The n first lead portions 031 include all or part of a set of signal lines such as power lines, drive lines, data lines, and fan-out lines. The lead structure 03 is configured to connect each LED in the LED layer and a control circuit, such that an electrical signal in the control circuit can be transmitted to each LED with high quality, making the LED emit light. In some embodiments, the first lead portion further includes a connecting electrode that directly contacts and is electrically connected to each LED.

In addition, the surface of one bending portion 022 distal from the base substrate 01 is conformal with the surface of the one or more bent lead portions 032, which are disposed on the bending portion 022, distal from the base substrate 01. At least two surfaces being conformal means that extension directions and undulations of the at least two surfaces are the same or similar.

In an exemplary embodiment, FIGS. 3, 4, 5, and 6 show schematic diagrams of different types of partial structures of the organic material layer 02. FIGS. 3, 4, 5, and 6 only show the first planar portion 021 and the bending portion 022 of the organic material layer 02, without the second planar portion 023. In addition, the positions of the bending portion 022 relative to the first planar portion 021 in FIGS. 3, 4, 5, and 6 may be matched with the shape of the base substrate. m=1 is taken as an example in FIG. 3, m=2 is taken as an example in FIG. 4, m=3 is taken as an example in FIG. 5, and m=4 is taken as an example in FIG. 6. In some embodiments, when the plane where the base substrate is disposed is in the shape of a pentagon, the first planar portion 021 is also in a shape of a pentagon, and m=5 at this time; or, when the plane where the base substrate is disposed is in the shape of a hexagon, the first planar portion 021 is also in the shape of a hexagon, and m=6 at this time, and so on. In addition, when m=1, the bending portion 022 may not be disposed on the right side of the first planar portion 021 as that shown in FIG. 3, for example, the bending portion 022 may be disposed on any side of the first planar portion 021 except the right side. When m=2, two bending portions 022 may not be disposed on the left and right sides of the first planar portion 021 as those shown in FIG. 4, for example, one of the two bending portions 022 may be disposed on the top side of the first planar portion 021, and the other may be disposed on the right side of the first planar portion 021, and the like. When m=3, three bending portions 022 may not be disposed on the left, right and top sides of the first planar part 021 as those shown in FIG. 5, for example, the three bending portions 022 may be disposed on the left, right and bottom sides of the first planar part 021 respectively. In the present embodiment of the present disclosure, the first planar portion 021 of the organic material layer is rectangular as an example. The first planar portion 021 may not be rectangular, but instead circular, elliptical, a triangular or the like. The expanded schematic diagram of the organic material layer 02 in FIG. 1 may refer to FIG. 4.

In some embodiments, in order to increase the surface tension of the bent lead portion and reduce the risk of breakage of the bending lead portion during the bending process, a recessed region may be provided on the surface of the bent lead portion 032 in the embodiments of the present disclosure. In an exemplary embodiment, the embodiment of the present disclosure is described by taking the surface of the bent lead portion 032 distal from the base substrate 01 having a recessed region as an example. It is also possible that the surface of the bent lead portion 032 proximal to the base substrate 01 has a recessed region, or both the surfaces of the bend lead portion 032 proximal to and distal from the base substrate 01 have recessed regions, which is not be limited in the embodiments of the present disclosure.

Figure 7:
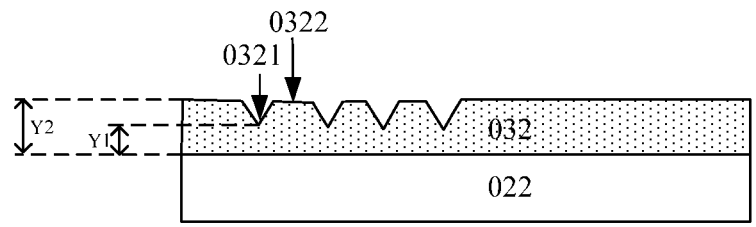
FIGS. 7 to 8 are expanded schematic diagrams of different embodiments of a bent lead portion and a bending portion according to an embodiment of the present disclosure.

In an exemplary embodiment, for any of the array substrates according to the embodiments of the present disclosure, FIG. 7 shows an expanded schematic diagram of the bent lead portion and the bending portion. As shown in FIG. 7, a first recessed region 0321 may be provided on the surface of the bent lead portion 032 distal from the base substrate by forming a groove and/or a protrusion on the surface of the bent lead portion 032 distal from the base substrate. The region in the surface of the bent lead portion 032 distal from the base substrate except the first recessed region 0321 is a first protruded region 0322. With respect to a position where the first recessed region 0321 of the bent lead portion 032 is disposed, a minimum distance between the surface of the bent lead portion 032 distal from the base substrate and the surface of the bent lead portion 032 proximal to the base substrate is Y1; and with respect to a position where the first protruded region 0322 of the bent lead portion 032 is disposed, a distance between the surface of the bent lead portion 032 distal from the base substrate and the surface of the bent lead portion 032 proximal to the base substrate is Y2, and Y1<Y2. In the embodiments of the present disclosure, the recessed region (such as the above-mentioned first recessed region) in the bent lead portion 032 may be formed by means of forming a groove on the bent lead portion. The groove may be formed by means of exposure and dry etching processes.

Figure 8:
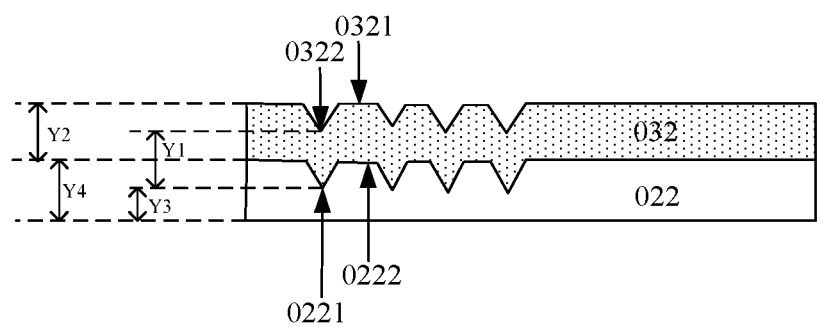

In another exemplary embodiment, for any of the array substrates according to the embodiments of the present disclosure, FIG. 8 shows another expanded schematic diagram of the bent lead portion and the bending portion. As shown in FIG. 8, a second recessed region 0221 may be provided on the surface of the bending portion 022 distal from the base substrate by methods of forming a groove and/or a protrusion on the surface of the bending portion 022 distal from the base substrate. The region in the surface of the bending portion 022 distal from the base substrate except the second recessed region 0221 is a second protruded region 0222. In the presence of the second recessed region 0221 on the bending portion 022, the surface of the bent lead portion 032 distal from the base substrate has the first recessed region 0321. The region in the surface of the bent lead portion 032 distal from the base substrate except the first recessed region 0321 is the first protruded region 0322.

With respect to a position where the first recessed region 0321 of the bent lead portion 032 is disposed, a minimum distance between the surface of the bent lead portion 032 distal from the base substrate and the surface of the bent lead portion 032 proximal to the base substrate is Y1; and with respect to a position where the first protruded region 0322 of the bent lead portion 032 is disposed, a distance between the surface of the bent lead portion 032 distal from the base substrate and the surface of the bent lead portion 032 proximal to the base substrate is Y2, and Y1=Y2. With respect to a position where the second recessed region 0221 of the bending portion 022 is disposed, a minimum distance between the surface of the bending portion 022 distal from the base substrate and the surface of the bending portion 022 proximal to the base substrate is Y3; and with respect to a position where the second protruded region 0222 of the bending portion 022 is disposed, a distance between the surface of the bending portion 022 distal from the base substrate and the surface of the bending portion 022 proximal to the base substrate is Y4, and Y3<Y4.

In the embodiments of the present disclosure, the second recessed region may be formed by methods of forming a groove on the bending portion. The groove may be formed by methods of exposure and dry etching processes.

In some embodiments, the shape of any of the aforementioned recessed regions may be any shape, such as V-shape, U-shape, or trapezoid, which is not limited in the embodiments of the present disclosure.

In some embodiments, in any of the array substrates according to the embodiments of the present disclosure, the LED layer may include a plurality of LEDs. The LEDs may be ordinary LEDs or miniature LEDs. The miniature LED has a size smaller than the ordinary LED. In an exemplary embodiment, the minimum size of the miniature LED can reach a micron level. The miniature LEDs in the embodiments of the present invention may include: micro light emitting diodes (micro LEDs) or mini light emitting diodes (mini-LEDs). The LEDs in the LED layer may be fixed on a flexible substrate provided with connecting electrodes by methods of any method (such as reflow soldering or eutectic soldering).

Figure 9:
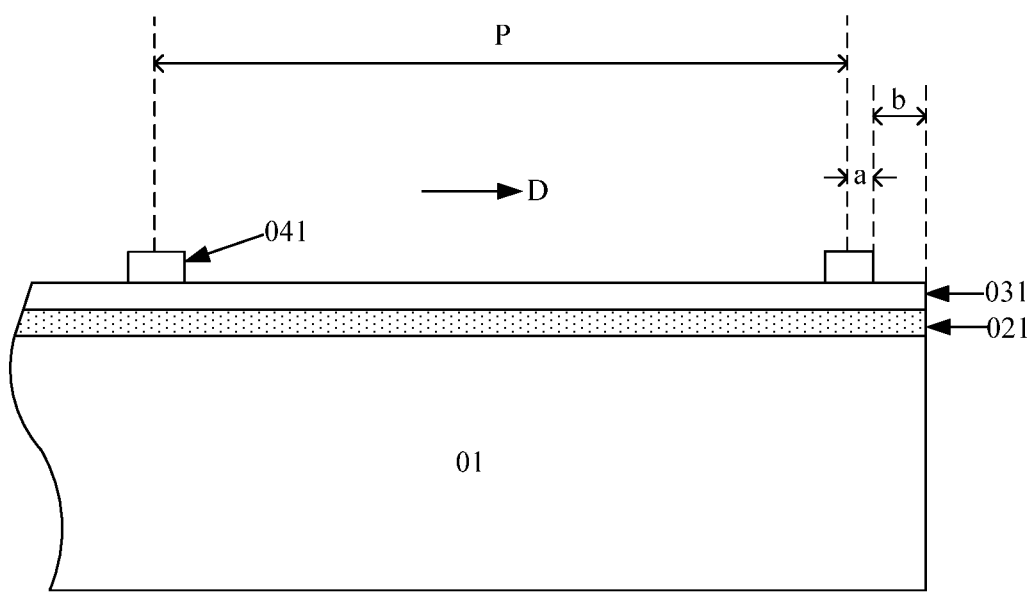
FIG. 9 is a schematic diagram of a plurality of LEDs in an LED layer according to an embodiment of the present disclosure.

In an exemplary embodiment, for any of the array substrates according to the embodiments of the present disclosure, FIG. 9 shows a schematic diagram of a plurality of LEDs 41 in an LED layer 04. As shown in FIG. 9, these LEDs 041 are all disposed on a side of the first lead portion 031 distal from the base substrate 01. The length of any LED 041 in an extension direction D of the base substrate 01 may be expressed as 2a. A distance between centers of any two LEDs 041 in the plurality of LEDs 041 may be expressed as P. A distance between the bending portion 022 (not shown in FIG. 9, please refer to FIG. 1) and the LED 041 proximal to the bending portion 022 among the plurality of LEDs 041 may be expressed as b. The array substrate may satisfy at least one of the conditions: b≥0.6a and b<P/2. For example, the array substrate satisfies b≥0.6a or b<P/2, or b≥0.6a and b<P/2. After testing and verification, when b≥0.6a, a luminous effect of the LEDs 041 is better, and accordingly, a display effect of the LED layer 04 is better. When b<P/2, a splicing effect between the array substrates is better, and accordingly, a display effect of a display device formed by splicing a plurality of array substrates is better.

In some embodiments, the array substrate according to the present embodiment of the present disclosure may further include: a black adhesive (represented by 06 in FIG. 1). The black adhesive is filled among the plurality of LEDs to improve the contrast of the respective LEDs. The black adhesive can also slightly cover a side of each LED distal from the base substrate, and at least part of light emitted by the LED can transmit through the black adhesive, which is not limited in the embodiments of the present disclosure.

In some embodiments, the control circuit provided by the present embodiment of the present disclosure may be any type of control circuit. The following will take eight types of control circuits as examples for description.

Figure 10:
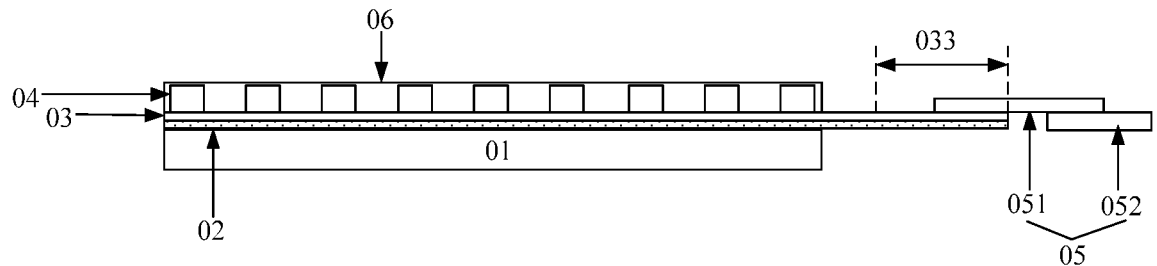
FIGS. 10 to 17 are expanded schematic diagrams of different embodiments of a partial structure of an array substrate according to an embodiment of the present disclosure.

(1) FIG. 10 is an expanded schematic diagram of a partial structure in FIG. 1 according to an embodiment of the present disclosure. With reference to FIG. 1 and FIG. 2, a control circuit 05 includes a flexible printed circuit (FPC) 051 and a printed circuit board (PCB) 052. The FPC 051 is disposed on a side of a lead structure (such as the second lead portion 033 in the lead structure) distal from the base substrate 01, and is connected to the second lead portion 033 and the PCB 052. The PCB 052 may be disposed on either side of the FPC 051. In the present embodiment of the present disclosure, for example, the PCB 052 and the second lead portion 033 are disposed on the same side of the FPC 051.

Figure 11:
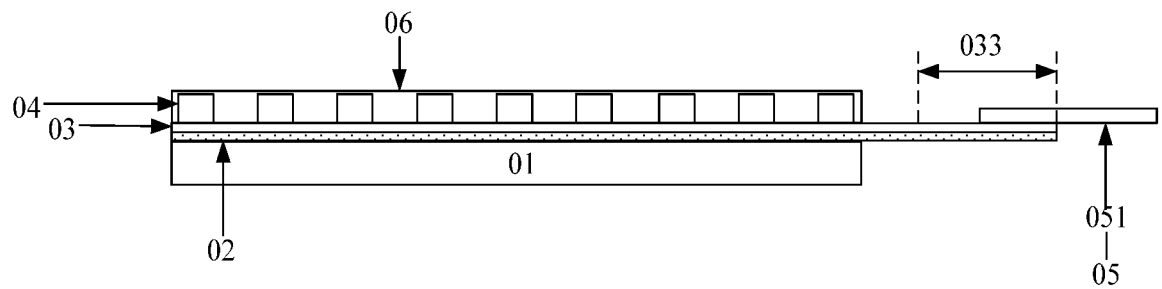

(2) FIG. 11 is an expanded schematic diagram of a partial structure in an array substrate according to an embodiment of the present disclosure. As shown in FIG. 11, based on FIG. 10, the control circuit 05 includes a FPC 051, but does not include a PCB 052. The FPC 051 is disposed on the side of the second lead portion 033 distal from the base substrate 01 and is connected to the second lead portion 033.

Figure 12:
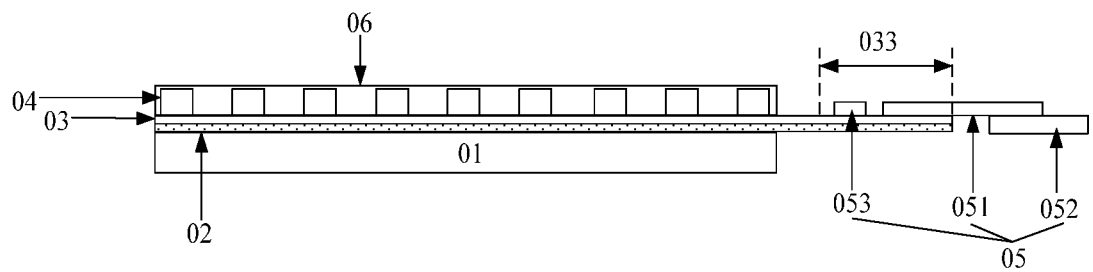

(3) FIG. 12 is an expanded schematic diagram of a partial structure in another array substrate according to an embodiment of the present disclosure. As shown in FIG. 12, based on FIG. 10, the control circuit 05 includes not only a FPC 051 and a PCB 052, but also a chip 053. The FPC 051 is disposed on the side of the second lead portion 033 distal from the base substrate 01, and is connected to the second lead portion 033 and the PCB 052; and the PCB 052 may be disposed on either side of the FPC 051, for example, in the present embodiment of the present disclosure, the PCB 052 and the second lead portion 033 are disposed on the same side of the FPC 051. The chip 053 is disposed on the side of the second lead portion 033 distal from the base substrate 01 and is connected to the second lead portion 033. The chip 053 and the FPC 051 are disposed on the same layer.

Figure 13:
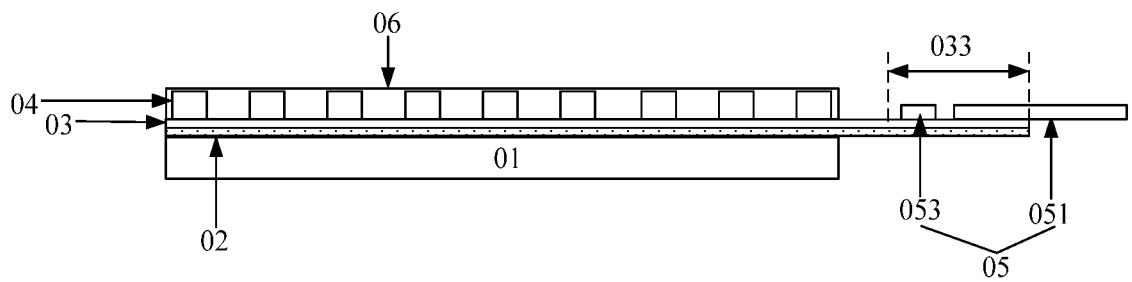

(4) FIG. 13 is an expanded schematic diagram of a partial structure in another array substrate according to an embodiment of the present disclosure. As shown in FIG. 13, based on FIG. 12, the control circuit 05 may not include the PCB 052.

Figure 14:
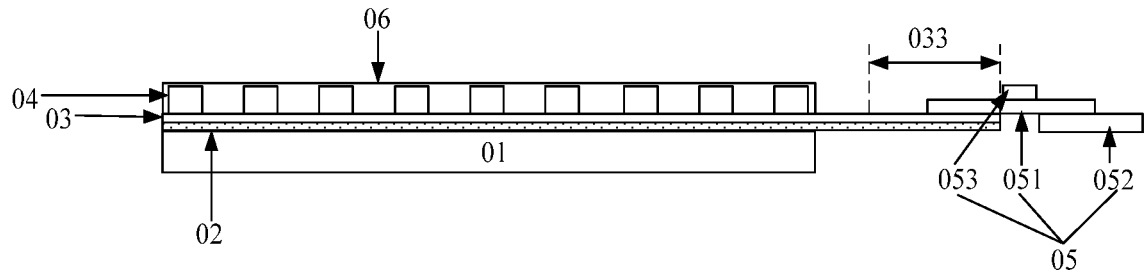

(5) FIG. 14 is an expanded schematic diagram of a partial structure in another array substrate according to an embodiment of the present disclosure. As shown in FIG. 14, based on FIG. 10, the control circuit 05 includes not only a FPC 051 and a PCB 052, but also a chip 053. The FPC 051 is disposed on the side of the second lead portion 033 distal from the base substrate 01. The PCB 052 may be disposed on either side of the FPC 051. In the present embodiment of the present disclosure, for example, the PCB 052 and the second lead portion 033 are disposed on the same side of the FPC 051. The chip 053 is disposed on a side of the FPC 051 distal from the base substrate 01, and the FPC 051 is connected to the second lead portion 033, the PCB 052, and the chip 053. When the chip 053 is disposed on the FPC 051, the chip 053 and the FPC 051 may be collectively referred to as chip on film (COF).

Figure 15:
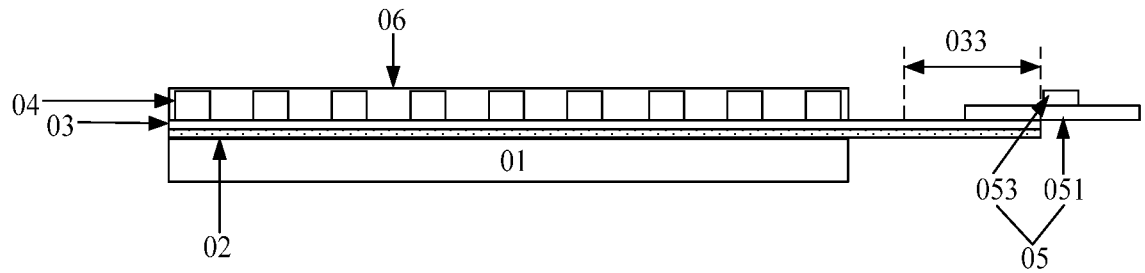

(6) FIG. 15 is an expanded schematic diagram of a partial structure in another array substrate according to an embodiment of the present disclosure. As shown in FIG. 15, based on FIG. 14, the control circuit 05 may not include the PCB 052.

Figure 16:
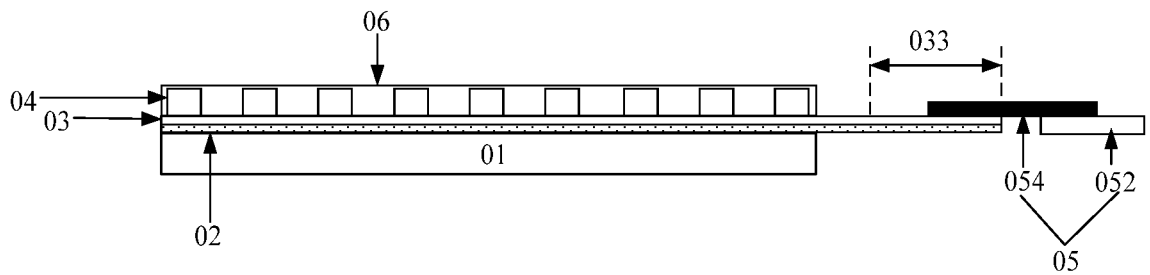

(7) FIG. 16 is an expanded schematic diagram of a partial structure in another array substrate according to an embodiment of the present disclosure. As shown in FIG. 16, based on FIG. 10, the control circuit 05 includes a connector 054. The connector 054 is disposed on the side of the second lead portion 033 distal from the base substrate 01, and is connected to the second lead portion 033 and the PCB 052. The PCB 052 may be disposed on either side of the connector 054. In the present embodiment of the present disclosure, for example, the PCB 052 and the second lead portion 033 are disposed on the same side of the connector 054.

Figure 17:
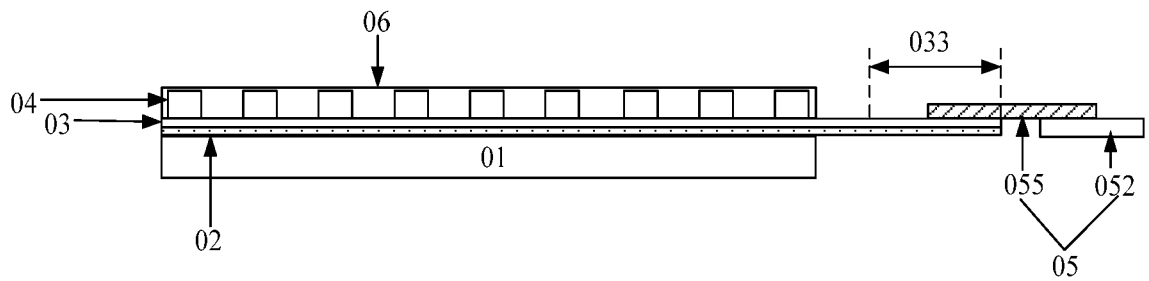

(8) FIG. 17 is an expanded schematic diagram of a partial structure in another array substrate according to an embodiment of the present disclosure. As shown in FIG. 17, based on FIG. 10, the control circuit 05 includes a terminal (such as a lead) 055. The terminal 055 is disposed on the side of the second lead portion 033 distal from the base substrate 01, and is connected to the second lead portion 033 and the PCB 052. The PCB 052 may be disposed on either side of the terminal 055. In the present embodiment of the present disclosure, for example, the PCB 052 and the second lead portion 033 are disposed on the same side of the terminal 055.

In some embodiments, regardless of the manner by which the control circuit 05 is implemented, the array substrate according to the embodiment of the present disclosure may further include: an adhesive disposed between the base substrate 01 and the control circuit 05 (see an adhesive 07 in FIG. 1). In the presence of the adhesive, the control circuit 05 can be effectively fixed on the base substrate 01, thereby ensuring the stability of the array substrate 01. The adhesive may be rubber. In an exemplary embodiment, when the control circuit 05 includes a PCB, the adhesive may be configured to adhere the PCB with the base substrate 01. When the control circuit 05 does not include a PCB, the adhesive may be configured to adhere FPC with the base substrate.

Further, as shown in FIG. 1, the array substrate provided by the embodiment of the present disclosure may further include a first spacer structure 08 disposed between the base substrate 01 and the bending portion 022. The first spacer structure 08 can support the bending portion 022 to prevent the bending portion 022 from breaking.

In some embodiments, the first spacer structure 08 may be made of any material, such as a material with adhesion or a material without adhesion. When the first spacer structure 08 is adhesive, the first spacer structure 08 can not only support the bending portion 022, but also fix the bending portion 022 with the base substrate 01, so as to improve the stability of the array substrate.

In some embodiments, in the array substrate according to the embodiment of the present disclosure, the surface of the first spacer structure distal from the base substrate may include an arc face. The arc face can improve a supporting effect of the first spacer structure on the bending portion. In an exemplary embodiment, the first spacer structure is diversified in shape. Four shapes of the first spacer structures will be described below as examples.

Figure 18:
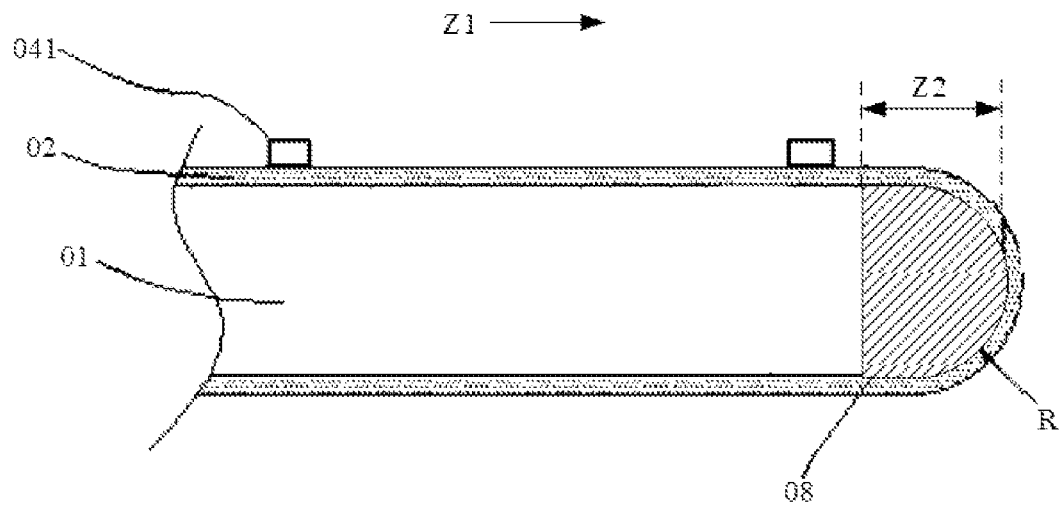
FIGS. 18 to 25 are schematic diagrams of different embodiments of a first spacer structure according to an embodiment of the present disclosure.

(1) FIG. 18 is a schematic diagram of a first spacer structure according to an embodiment of the present disclosure (a wire structure is not shown in FIG. 18). As shown in FIG. 18, the surface of the first spacer structure 08 distal from the base substrate 01 is a semicircular arc face. In addition, in an arrangement direction Z1 of the base substrate 01 and the first spacer structure 08, a maximum length Z2 of the first spacer structure 08 is greater than the radius R of the semicircular arc face.

Figure 19:
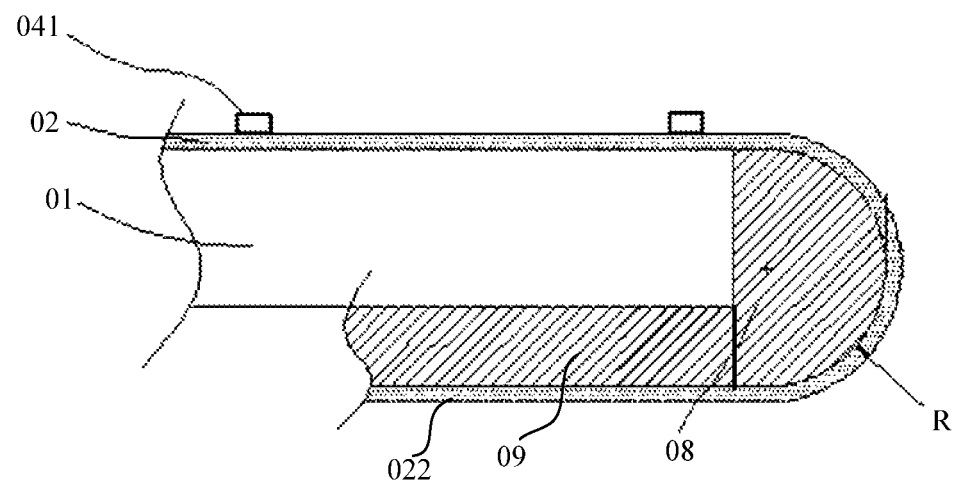

(2) FIG. 19 is a schematic diagram of another first spacer structure according to an embodiment of the present disclosure (a wire structure is not shown in FIG. 19). As shown in FIG. 19, based on FIG. 18, the array substrate further includes a second spacer structure 09 disposed between a base substrate 01 and a second planar portion 022, and the second spacer structure 09 is connected to the first spacer structure 08. At this time, a contact area between the base substrate 01 and an entire body formed by the first spacer structure 08 and the second spacer structure 09 is relatively large, such that the array substrate has better stability and is easier to be assembled. In some embodiments, a side of the first spacer structure 08 proximal to the second spacer structure 09 is disposed on an extension plane of the third side X3, and a side of the second spacer structure 09 proximal to the first spacer structure 08 is disposed on the extension plane of the third side X3. It can be understood that when a connection portion between the second side X2 and the third side X3 includes a chamfered structure, the side of the first spacer structure 08 proximal to the second spacer structure 09 and the side of the second spacer structure 09 proximal to the first spacer structure 08 are both disposed on an extension plane of a plane where a main region except the chamfered structure of the third side X3 is disposed. The first spacer structure 08 and the second spacer structure 09 may be of an integral structure.

It should be noted that an extension length of the second spacer structure 09 is not limited in the embodiments of the present disclosure. In an exemplary embodiment, when a structure (such as an adhesive 07 in FIG. 1) needs to be provided on the second side of the base substrate, the second spacer structure 09 may extend to a position where this structure is disposed, and may be disposed between the base substrate and this structure; or, the second spacer structure 09 may also extend through the position where this structure is disposed, and may be disposed between the base substrate and this structure; or, the second spacer structure 09 may not extend to the position where this structure is disposed, and in this case, the second spacer structure 09 and this structure are arranged side by side on the second side of the base substrate.

Figure 20:
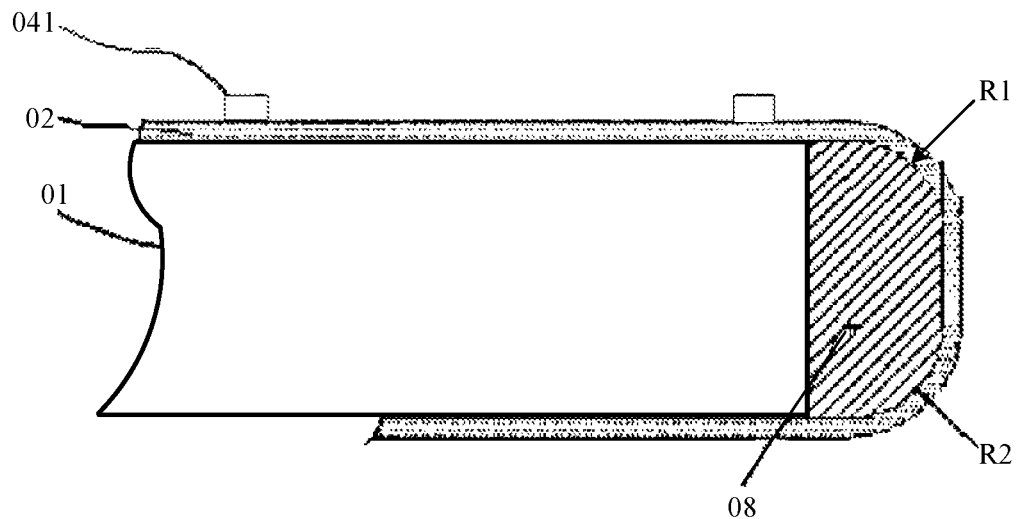

(3) FIG. 20 is a schematic diagram of another first spacer structure according to an embodiment of the present disclosure (a wire structure is not shown in FIG. 20). As shown in FIG. 20, the surface of the first spacer structure 08 distal from the base substrate 01 includes a first arc face, a plane and a second arc face which are connected in sequence, wherein a radius R1 of the first arc face is equal to a radius R2 of the second arc face.

Figure 21:
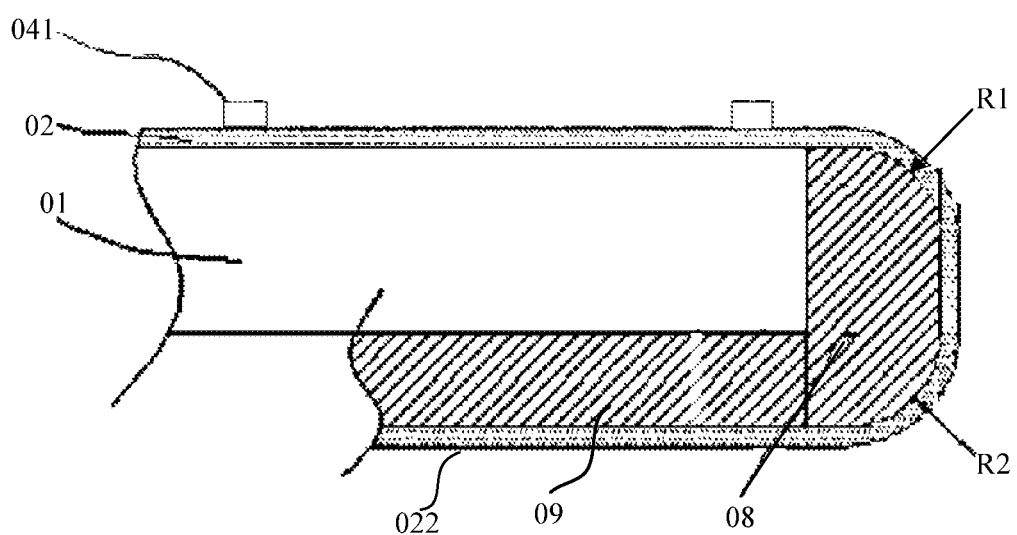

(4) FIG. 21 is a schematic diagram of another first spacer structure according to an embodiment of the present disclosure (a wire structure is not shown in FIG. 21). As shown in FIG. 21, based on FIG. 20, the array substrate further includes a second spacer structure 09. For details about the second spacer structure 09 in FIG. 21, reference may be made to the second spacer structure 09 in FIG. 19, which are not repeated in the embodiment of the present disclosure.

Figure 22:
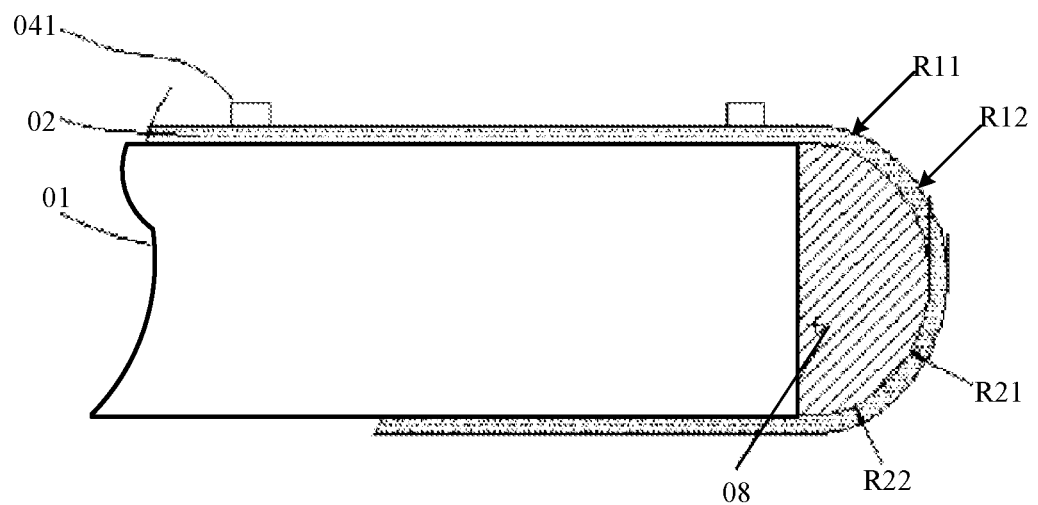

(5) FIG. 22 is a schematic diagram of another first spacer structure according to an embodiment of the present disclosure (a wire structure is not shown in FIG. 22). As shown in FIG. 22, the surface of the first spacer structure 08 distal from the base substrate 01 includes n first arc faces, a plane, and n second arc faces, which are connected in sequence, $n>1$. The radii of the n first arc faces are different from each other, and the radius of an $i^{th}$ first arc face is equal to the radius of an $(n-i+1)^{th}$ second arc face, $1 \leq i \leq n$. In FIG. 22, $n=2$ is taken as an example. In this case, the first spacer structure 08 has two first arc faces and two second arc faces, wherein the radius R11 of a $1^{st}$ first arc face is equal to the radius R22 of a $2^{nd}$ second arc face, and the radius R12 of the $2^{nd}$ first arc face is equal to the radius R21 of the $1^{st}$ second arc face.

Figure 23:
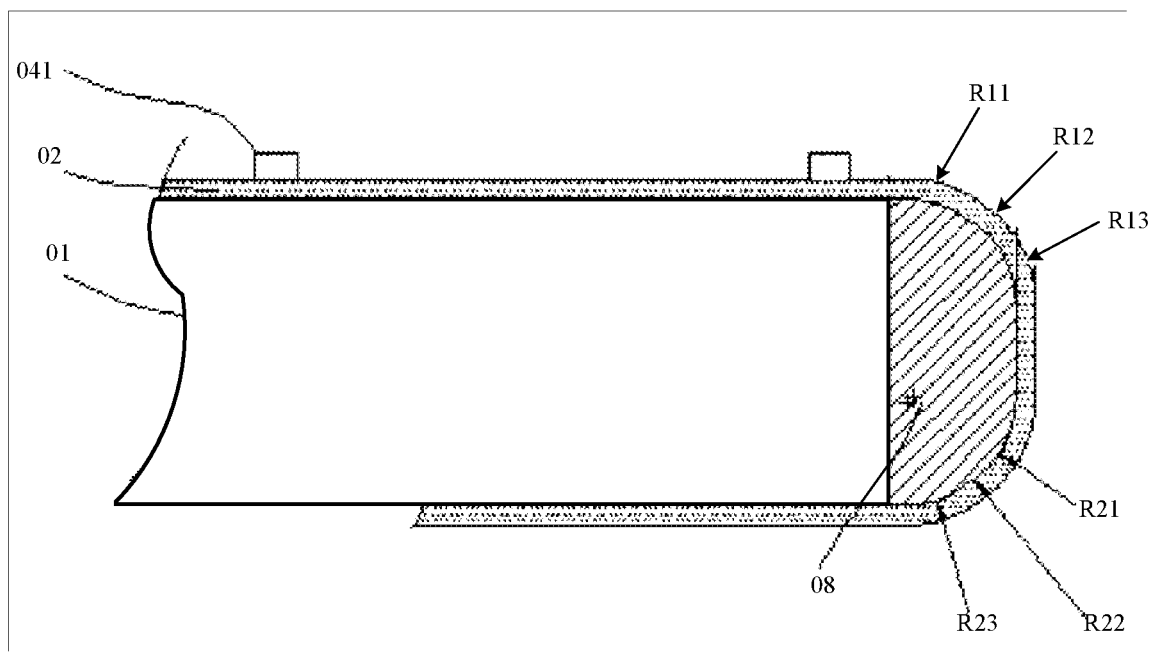

(6) FIG. 23 is a schematic diagram of yet another first spacer structure according to an embodiment of the present disclosure (a wire structure is not shown in FIG. 23). As shown in FIG. 23, when n=3, the first spacer structure 08 has three first arc faces and two second arc faces, wherein the radius R11 of the $1^{st}$ first arc face is equal to the radius R23 of a $3^{rd}$ second arc face, the radius R12 of the $2^{nd}$ first arc face is equal to the radius R22 of the $2^{nd}$ second arc face, and the radius R13 of the $3^{rd}$ first arc face is equal to the radius R21 of the $1^{st}$ second arc face.

Figure 24:
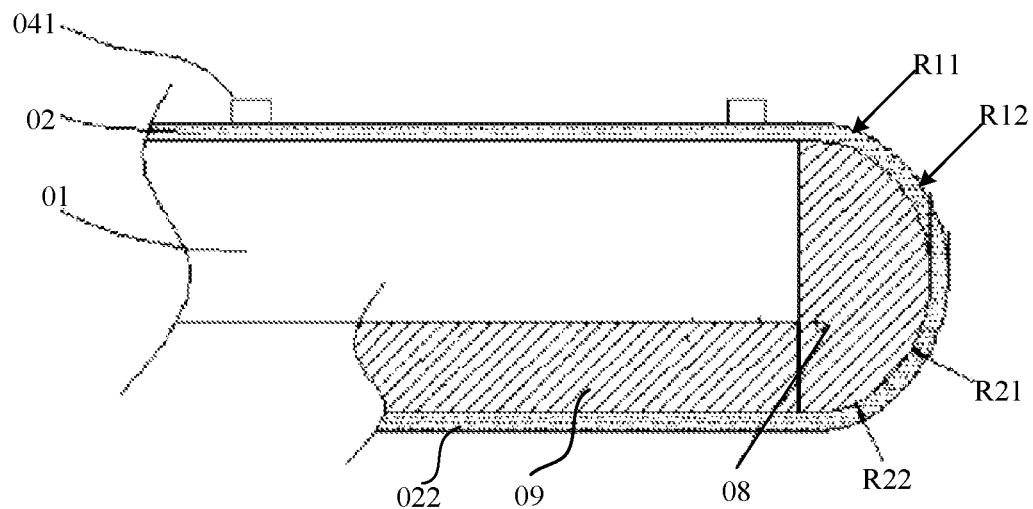

(7) FIG. 24 is a schematic diagram of yet another first spacer structure according to an embodiment of the present disclosure (a wire structure is not shown in FIG. 24). As shown in FIG. 24, based on FIG. 22, the array substrate further includes a second spacer structure 09. The second spacer structure 09 in FIG. 24 may refer to the second spacer structure 09 in FIG. 19, and the details are not repeated in the embodiment of the present disclosure.

Figure 25:
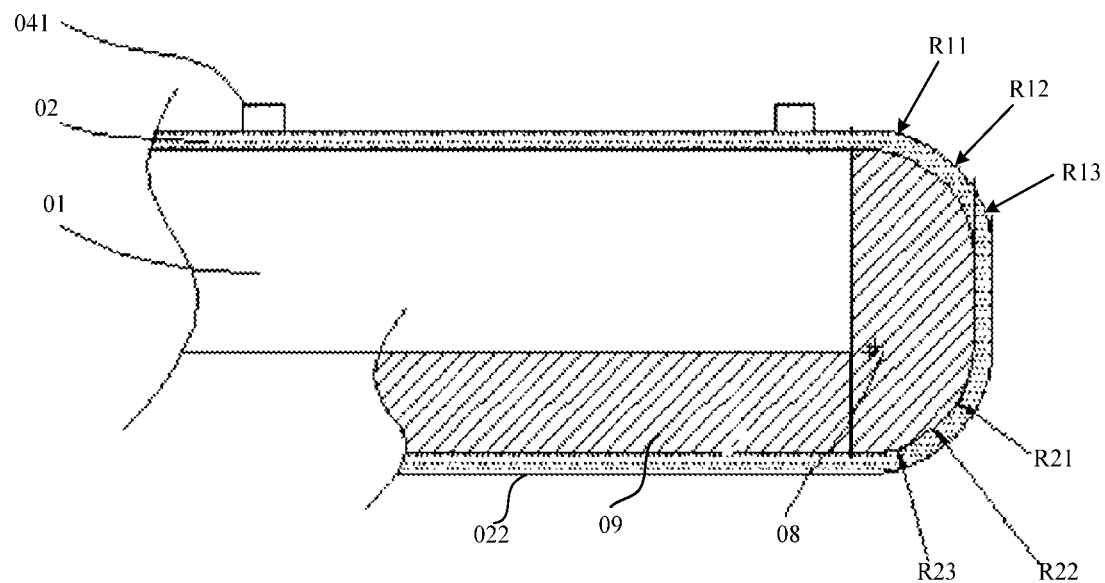

(8) FIG. 25 is a schematic diagram of another first spacer structure according to an embodiment of the present disclosure (a wire structure is not shown in FIG. 25). As shown in FIG. 25, based on FIG. 23, the array substrate further includes a second spacer structure 09. The second spacer structure 09 in FIG. 25 may refer to the second spacer structure 09 in FIG. 19, and the details are not repeated in the embodiment of the present disclosure.

Figure 26:
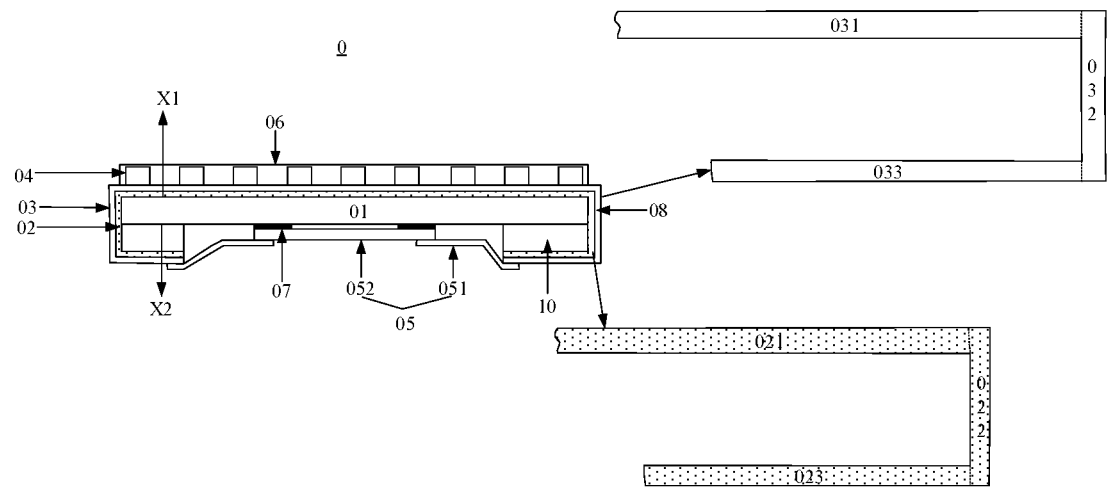
FIGS. 26 to 28 are schematic structural diagrams of different embodiments of an array substrate according to an embodiment of the present disclosure.

Further, FIG. 26 is a schematic structural diagram of another array substrate according to an embodiment of the present disclosure. As shown in FIG. 26, based on FIG. 1, the array substrate further includes a binding substrate 10 disposed between the base substrate 01 and the second planar portion 023. In some embodiments, the base substrate 01 may be made of the same material as the binding substrate 10, and a thickness of the base substrate 01 is the same as a thickness of the binding substrate 10. The base substrate 01 may be configured to support the second planar portion 023. It should be noted that the array substrate shown in FIG. 26 may include the abovementioned spacer structures (such as the first spacer structure 021 and the second spacer structure 023), or may not include a spacer structure. The spacer structure is not shown in FIG. 26.

Figure 27:
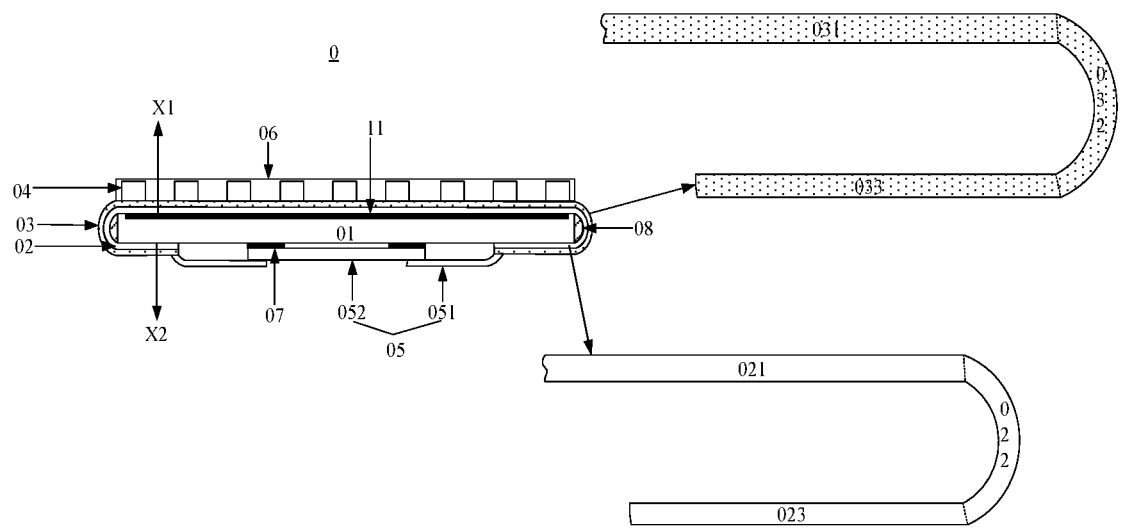

In some embodiments, the array substrate further includes a light reflecting layer disposed between the base substrate and the first planar portion. In an exemplary embodiment, FIG. 27 is a schematic structural diagram of another array substrate according to an embodiment of the present disclosure. As shown in FIG. 27, based on FIG. 1, the array substrate further includes a light reflecting layer 11. In some embodiments, a distance between the light reflecting layer 11 and the bending portion 022 is greater than 0.

Figure 28:
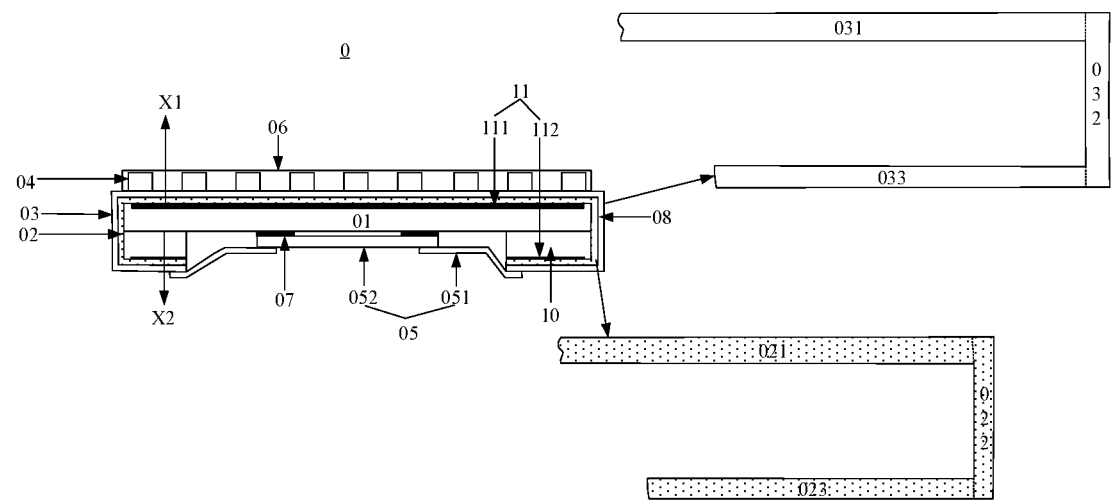

In some embodiments, FIG. 28 is a schematic structural diagram of another array substrate according to an embodiment of the present disclosure. As shown in FIG. 28, based on FIG. 26, the array substrate further includes a light reflecting layer 11. The light reflecting layer 11 includes a first light reflecting portion 111 disposed between the base substrate 01 and the first planar portion 021, and a second light reflecting portion 112 disposed between the binding substrate 10 and the second planar portion 023. In some embodiments, a distance between the first light reflecting portion 111 and the bending portion 022 is greater than 0, and a distance between the second light reflecting portion 112 and the bending portion 022 is also greater than 0.

In summary, in the array substrates according to the embodiments of the present disclosure, the organic material layer and the lead structure are both bent to the second side of the base substrate, such that the lead structure is bound with the control circuit on the other side (the second side) of the side (the first side) where the LED layer is disposed. This avoids the problem of a relatively wide border of the array substrate caused by binding the lead structure with the control circuit on the side (the first side) where the LED layer is disposed. When a plurality of display substrates are spliced, a seam between every two adjacent display substrates can be effectively reduced.

An embodiment of the present disclosure provides a display device. The display device may include any of the array substrates according to the embodiments of the present disclosure. In some embodiments, the display device may further include cover plates which are in one-to-one correspondence to the array substrates according to the embodiment of the present disclosure, and each cover plate is disposed on a side of an LED layer in the corresponding array substrate distal from a base substrate.

In an exemplary embodiment, the display device may be any product or component having a display function, such as electronic paper, a mobile phone, a tablet computer, a television, a display, a laptop computer, a digital photo frame, or a navigator.

Figure 29:
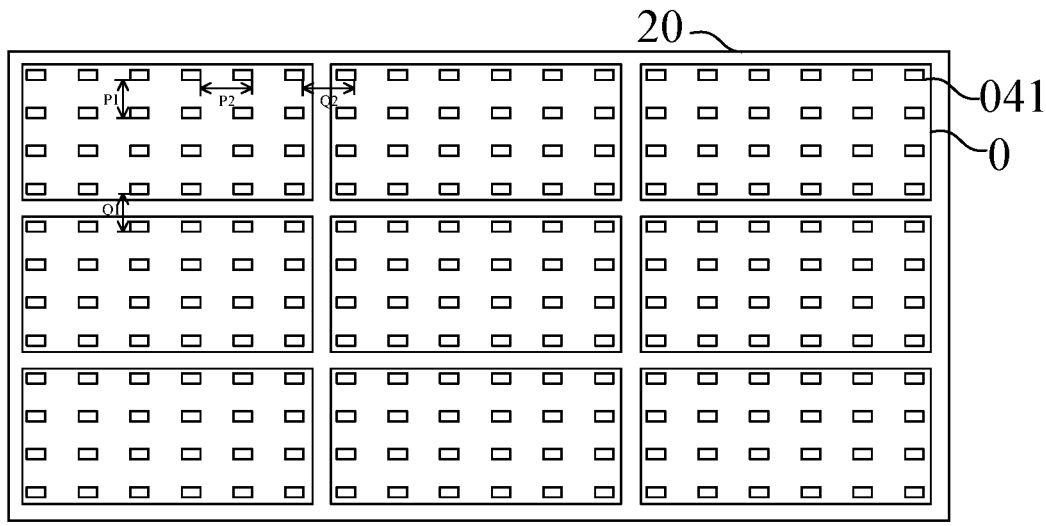
FIG. 29 is a schematic structural diagram of a display device according to an embodiment of the present disclosure.
Figure 30:
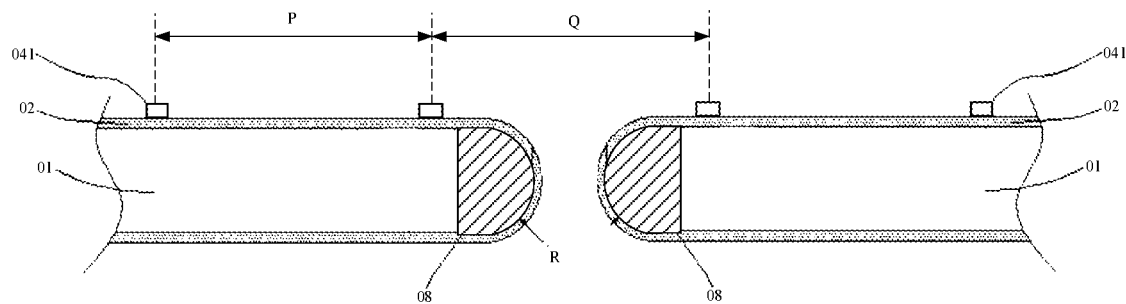
FIGS. 30 to 34 are schematic diagrams of spliced positions of any two array substrates in different embodiments of a display device according to an embodiment of the present disclosure.
Figure 31:
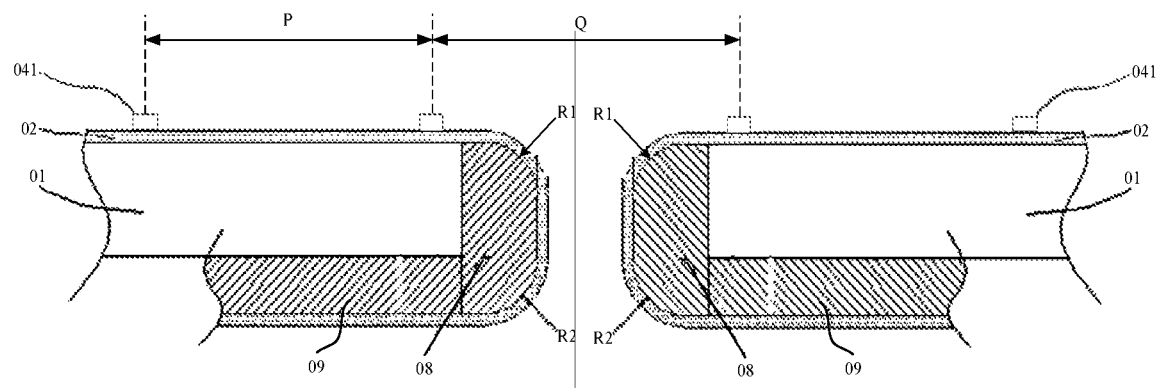
Figure 32:
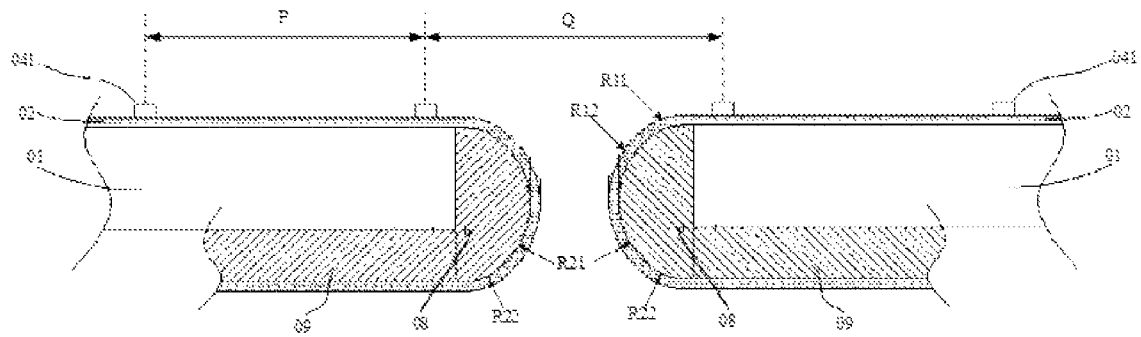
Figure 33:
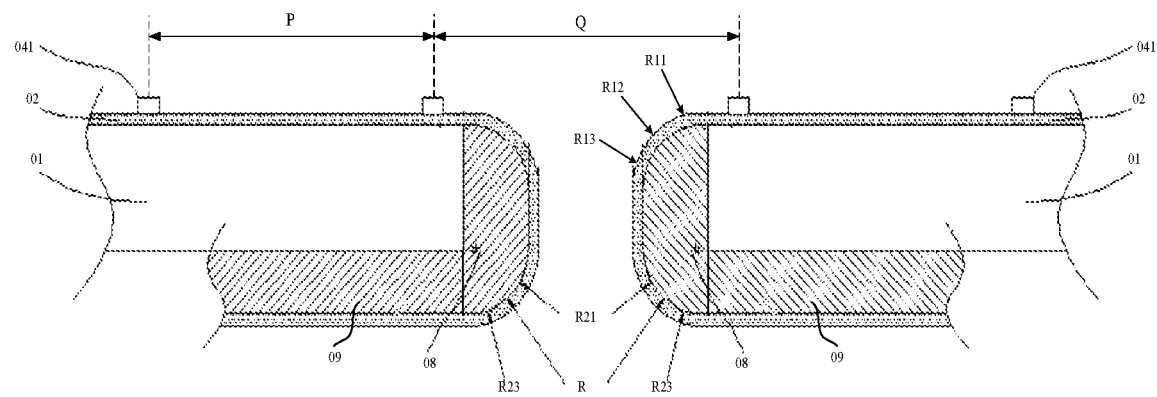
Figure 34:
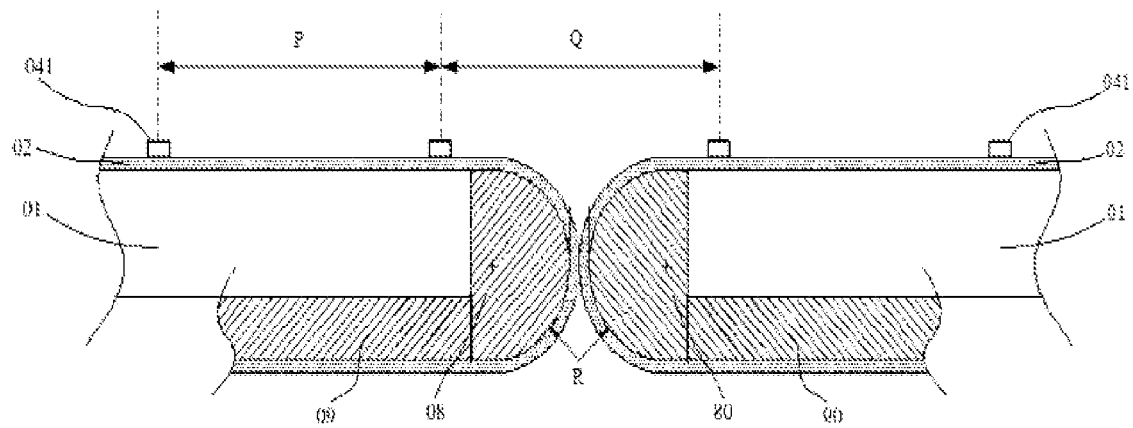

In some embodiments, FIG. 29 is a schematic structural diagram of a display device according to an embodiment of the present disclosure. The display device 20 may include a plurality of array substrates 0 which is spliced with each other. Because a border of the array substrate according to the embodiments of the present disclosure is relatively narrow, a border of the array substrate 0 according to the present embodiment of the present disclosure is relatively narrow. In the display device 20 including a plurality of array substrates 0 that is spliced, a seam between every two adjacent array substrates is relatively narrow. It may be understood that in any two adjacent array substrates 0 among the plurality of array substrates 0 arranged in a first direction (as shown in a vertical direction in FIG. 29), a distance between two closest LEDs in the first direction is Q1, and a distance between two LEDs arranged in the first direction in each array substrate 0 is P1, and P1=Q1. In any two adjacent array substrates 0 among the plurality of array substrates 0 arranged in a second direction (as shown in a horizontal direction in FIG. 29), a distance between two closest LEDs in the second direction is Q2, and a distance between two LEDs arranged in the second direction in each array substrate 0 is P2, and P2=Q2. As such, when the display device 20 displays an image, it is difficult for a viewer to notice the existence of borders of adjacent array substrates, that is, it is also difficult or impossible to see seams caused by the splicing of the array substrates.

In some embodiments, the display device 20 may also include a frame support (not shown in FIG. 29) on a non-display side of the plurality of array substrates 0. The plurality of array substrates 0 in the display device 20 may be fixed on the frame support (for example, the second side of the base substrate in the array substrate is connected to a support) by a mechanical force, an adhesive force, a magnetic force, or the like, such that the plurality of array substrates 0 is spliced to form the display device 20.

In some embodiments, an LED layer in each array substrate includes a plurality of LEDs disposed on a first planar portion, wherein a distance between centers of any two LEDs in the plurality of LEDs is P; and in any two adjacent array substrates in the display device, a distance between centers of two closest LEDs is Q, and P=Q. In some embodiments, the distance between any two adjacent array substrates in the display device is greater than or equal to 0.

In an exemplary embodiment, FIGS. 30, 31, 32, 33, and 34 are schematic diagrams of spliced positions of any two array substrates in five kinds of display devices according to embodiments of the present disclosure. In FIGS. 30, 31, 32, and 33, the distance between adjacent array substrates being greater than 0 is taken as an example; and in FIG. 34, the distance between adjacent array substrates being equal to 0 is taken as an example. For details about a spacer structure in FIG. 30, a spacer structure in FIG. 31, a spacer structure in FIG. 32, a space structure in FIG. 33, and a spacer structure in FIG. 34, reference may be made to FIG. 18, FIG. 21, FIG. 24, FIG. 25, and FIG. 19 respectively.

It should be noted that when the distance between adjacent array substrates in the display device is greater than 0, it is less difficult to splice a plurality of array substrates. The smaller the length of the first spacer structure in the array substrate in an arrangement direction of the base substrate and the first spacer structure is, the larger the distance between adjacent array substrates in the display device is, and the less difficult to splice a plurality of array substrates is. Therefore, in the embodiments of the present disclosure, the distance between adjacent array substrates and the abovementioned length of the first spacer structure can be set reasonably according to the difficulty of splicing the array substrates.

An embodiment of the present disclosure provides a method for manufacturing an array substrate. The method is applicable to manufacturing any of the array substrates according to embodiments of the present disclosure. As shown in FIG. 35, the method may include the following steps:

Step 3501: An initial structure is formed, wherein the initial structure includes a base substrate, an organic material layer, a lead structure, an LED layer, and a control circuit; the base substrate includes a first side and a second side opposite to each other, and a third side adjacent to the first side and the second side; wherein the organic material layer, the lead structure, and the LED layer are all disposed on the first side of the base substrate, and are sequentially arranged in a direction away from the base substrate, and the control circuit and the LED layer are disposed on the same layer; an orthographic projection of the organic material layer on a plane where the base substrate is disposed is partially overlapped with an orthographic projection of the base substrate on the plane where the base substrate is disposed; and a side of the organic material layer distal from the base substrate is covered by the lead structure, and the lead structure is connected to the LED layer and the control circuit.

Step 3502: The control circuit is moved from the first side of the base substrate to the second side of the base substrate by bending the organic material layer and the lead structure, wherein the bent organic material layer includes a first planar portion, a bending portion and a second planar portion which are connected in sequence; the first planar portion is disposed on the first side of the base substrate, the second planar portion is disposed on the second side of the base substrate, and the bending portion is disposed on the third side; the bent lead structure includes a first lead portion, a bent lead portion, and a second lead portion which are connected in sequence, wherein the first lead portion is disposed on a side of the first planar portion distal from the base substrate and is connected to the LED layer, the bent lead portion is disposed on a side of the bending portion distal from the base substrate, and the second lead portion is disposed on a side of the second planar portion distal from the base substrate and is connected to the control circuit.

The method for manufacturing the array substrate according to the embodiments of the present disclosure is relatively easy to implement, and therefore, can facilitate mass production.

Figure 36:
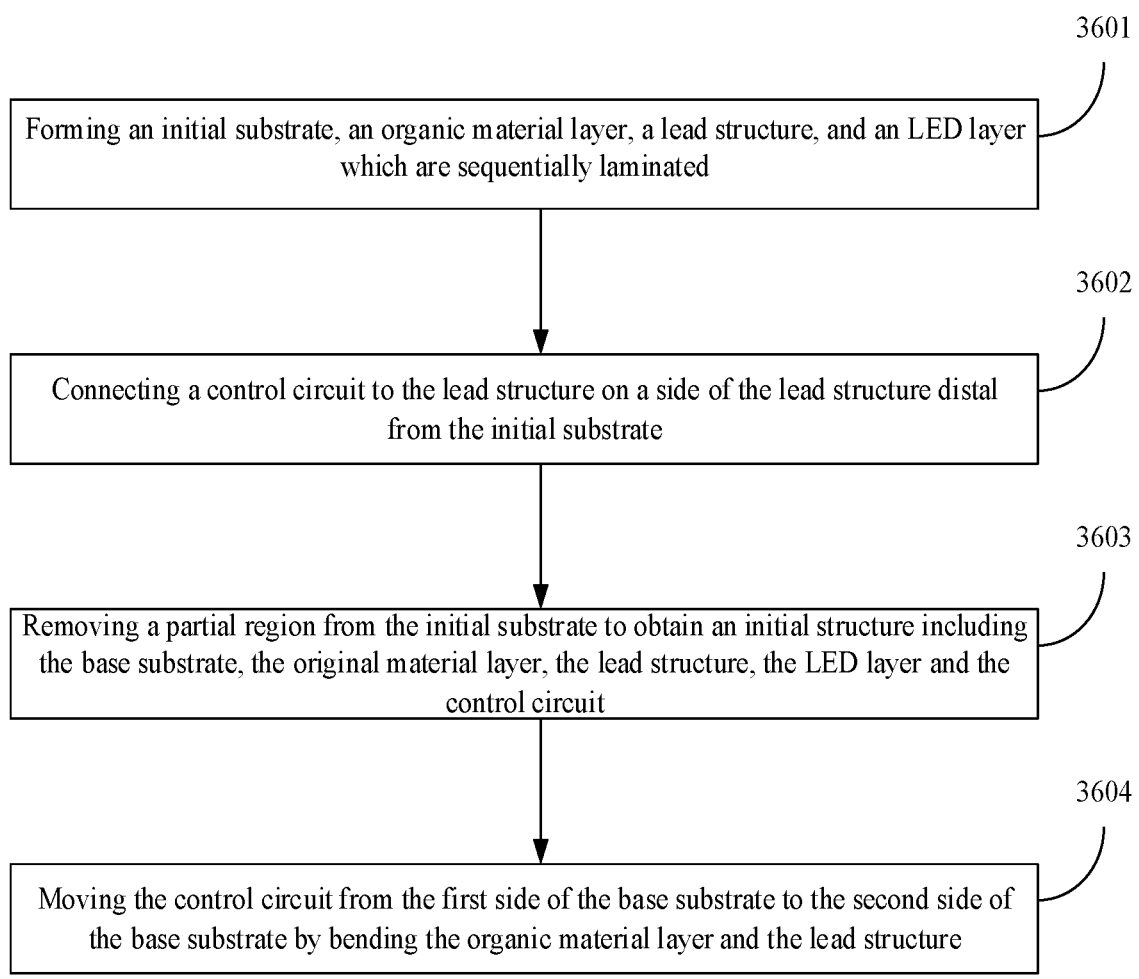
FIG. 36 is a flowchart of a method for manufacturing another array substrate according to an embodiment of the present disclosure.

FIG. 36 is a flowchart of a method for manufacturing another array substrate according to an embodiment of the present disclosure. The method is used for manufacturing the array substrate shown in FIG. 1. As shown in FIG. 36, the method may include the following steps.

Step 3601: An initial substrate, an organic material layer, a lead structure and an LED layer which are sequentially laminated are formed.

Figure 37:
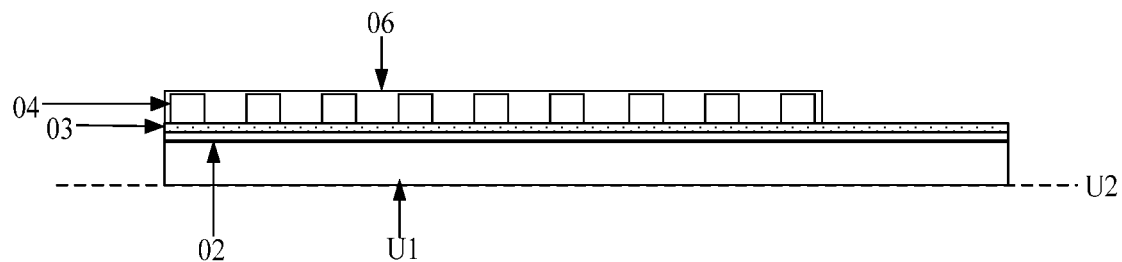
FIGS. 37 to 49 are schematic diagrams of a manufacturing process of an array substrate according to an embodiment of the present disclosure.

As shown in FIG. 37, a plane U2 paralleled to the initial substrate U1 is the plane where the initial substrate U1 is disposed. An orthographic projection of the organic material layer 02 on the plane U2 is within an orthographic projection of the initial substrate U1 on the plane U2. The lead structure 03 covers a side of the organic material layer 02 distal from the initial substrate U1, and is connected to the LED layer 04.

In step 3601, the organic material layer, the lead structure, and the LED layer may be sequentially formed on the initial substrate.

Further, in 3601, a flexible film layer (the flexible film layer may partially cover a basic substrate) and a lead layer may be sequentially formed on the basic substrate first. Then, the basic substrate formed with the flexible film layer and the lead layer is cut into a plurality of substrate units. Each of the substrate units includes an initial substrate obtained by cutting the basic substrate, an organic material layer obtained by cutting the flexible film layer, and a lead structure obtained by cutting the lead layer. Finally, a plurality of LEDs is formed on the lead structure of each substrate unit by means of a mass transfer technology, thereby forming the LED layer on each of the substrate unit.

In some embodiments, when step 3601 is finished, black adhesive may be applied to a side of the LED layer distal from the initial substrate. The black adhesive can improve a display effect of the LED layer, protect the LED layer, and increase the soldering strength of the LED layer.

Step 3602: A control circuit is connected to the lead structure on a side of the lead structure distal from the initial substrate.

Figure 38:
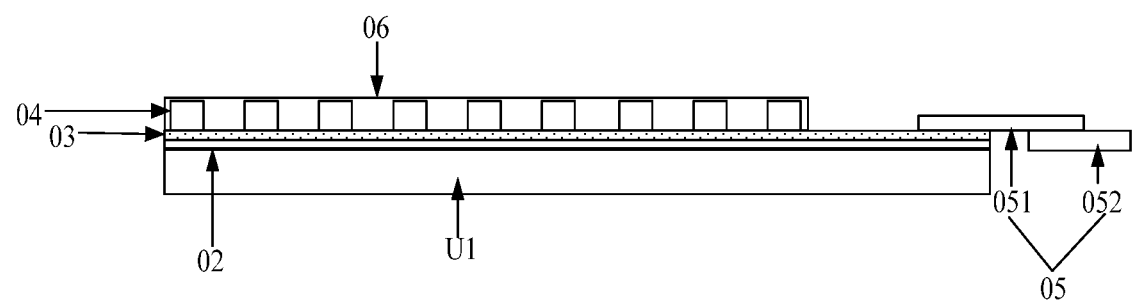

The structure obtained by connecting the control circuit 05 and the lead structure 03 may be as shown in FIG. 38. In the present embodiment of the present disclosure, the control circuit 05 includes a FPC 051 and a PCB 052, and the lead structure 03 is connected to the FPC 051; a connection is taking example, as the FPC 051 is connected to the PCB 052 and the FPC 051 is connected to the PCB 052. The connection portion between FPC 051 and PCB 052 is taken as example.

Step 3603: A partial region is removed from the initial substrate to obtain an initial structure including the base substrate, the organic material layer, the lead structure, the LED layer, and the control circuit.

Figure 39:
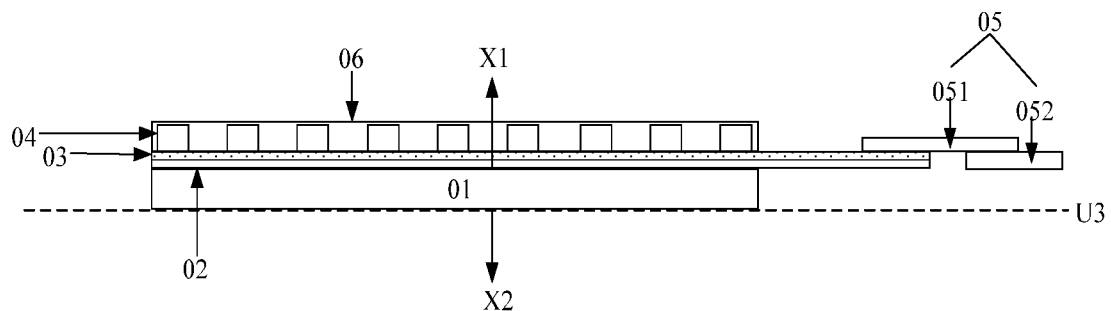

An orthographic projection of the partial region on the plane where the initial substrate is disposed is outside an orthographic projection of the LED layer on the plane where the initial substrate is disposed. In an exemplary embodiment, after the partial region of the initial substrate is removed, the initial substrate can be changed to the base substrate 01 as shown in FIG. 39. The organic material layer 02, the lead structure 03, and the LED layer 04 are all disposed on a first side X1 of the base substrate 01, and are sequentially arranged in a direction away from the base substrate 01. The control circuit 05 and the LED layer 04 are disposed on the same layer. A plane U3 paralleled to the base substrate 01 is the plane where the base substrate 01 is disposed. An orthographic projection of the organic material layer 02 on the plane U3 is partially overlapped with an orthographic projection of the base substrate 01 on the plane U3. The lead structure covers a side of the organic material layer 02 distal from the base substrate 01, and is connected to the LED layer 04 and the control circuit 05.

Step 3604: The control circuit is moved from the first side of the base substrate to a second side of the base substrate by bending the organic material layer and the lead structure.

As shown in FIG. 1, the second side X2 is opposite to the first side X1. The bent organic material layer 02 includes a first planar portion 021, a bending portion 022 and a second planar portion 023 which are connected in sequence. The first planar portion 021 is disposed on the first side X1 of the base substrate 01. The bending portion 022 is bent from the first side X1 to the second side X2 of the base substrate 022. The second planar portion 023 is disposed on the second side X2 of the base substrate 01. The bent lead structure 03 includes a first lead portion 031, a bent lead portion 032, and a second lead portion 033 which are connected in sequence, wherein the first lead portion 031 is disposed on a side of the first planar portion 021 distal from the base substrate 01 and is connected to the LED layer 04, the bent lead portion 032 is disposed on a side of the bending portion 022 distal from the base substrate 01, and the second lead portion 033 is disposed on a side of the second planar portion 023 distal from the base substrate 01 and is connected to the control circuit 05.

In some embodiments, step 3603 may be performed in multiple ways. The embodiments of the present disclosure are described by taking the following two implementations as examples.

Figure 40:
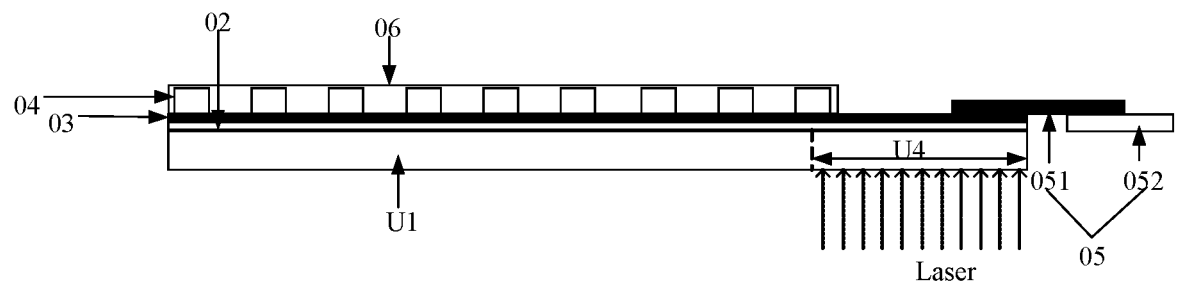
Figure 41:
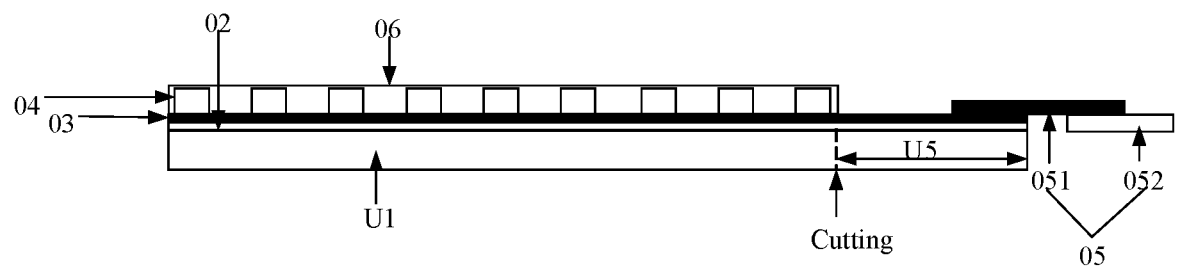
Figure 42:
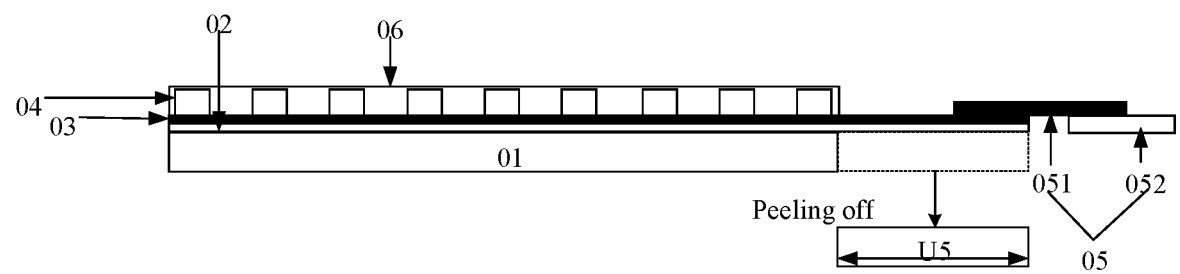

(1) In step 3603, as shown in FIG. 40, laser may be irradiated to a region U4 to be separated of the initial substrate U1 from a side of the initial substrate U1 distal from the organic material layer 02, such that the region U4 to be separated is separated from the organic material layer 02. The partial region U5 to be removed may be disposed in the region U4 to be separated and is smaller than the region U4 to be separated. Then, as shown in FIG. 41, the edge of the partial region U5 on the initial substrate U1 may be cut. Finally, as shown in FIG. 42, the partial region U5 is peeled off.

In some embodiments, if the prepared base substrate has a chamfered structure proximal to the bending portion, the chamfered structure may be formed in the process of cutting the edge of the partial region U5 on the initial substrate U1.

Figure 43:
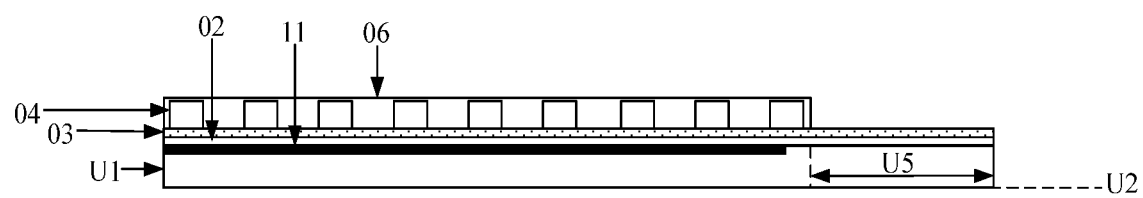

(2) Further, in step 3603, prior to forming the organic material layer on the initial substrate, as shown in FIG. 43, a light reflecting layer 11 may be formed on the initial substrate U1. An orthographic projection of the light reflecting layer 11 on a plane U2 where the initial substrate is disposed is outside an orthographic projection of the partial region U5 on the plane U2 where the initial substrate is disposed. In some embodiments, the orthographic projection of the light reflecting layer 11 on the plane U2 where the initial substrate is disposed may be spaced apart from the orthographic projection of the partial region U5 on the plane U2 where the initial substrate is disposed.

Figure 44:
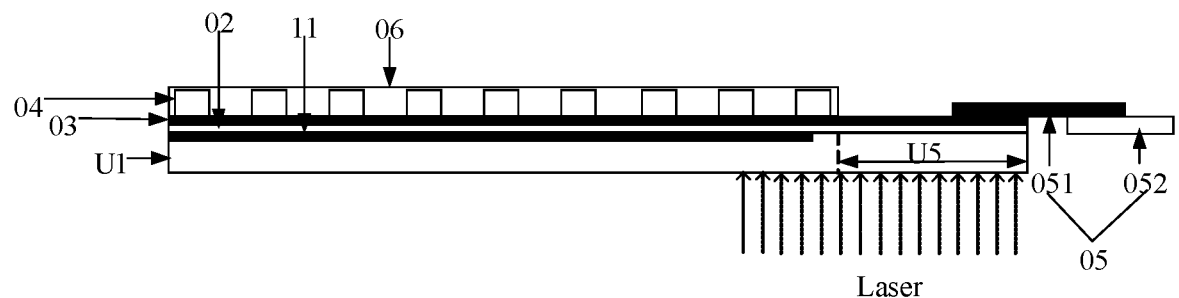
Figure 45:
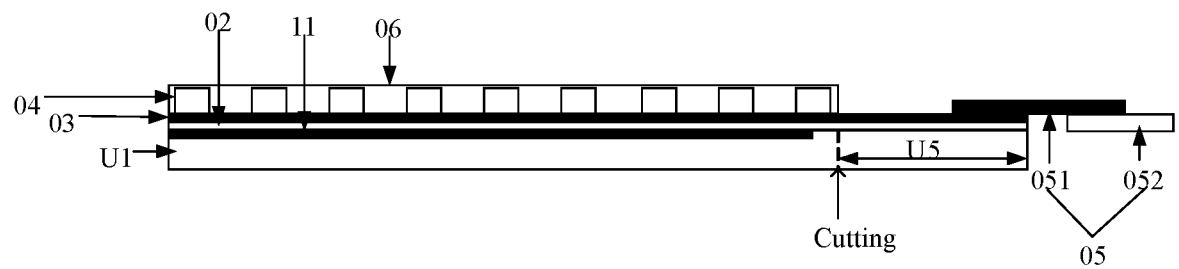
Figure 46:
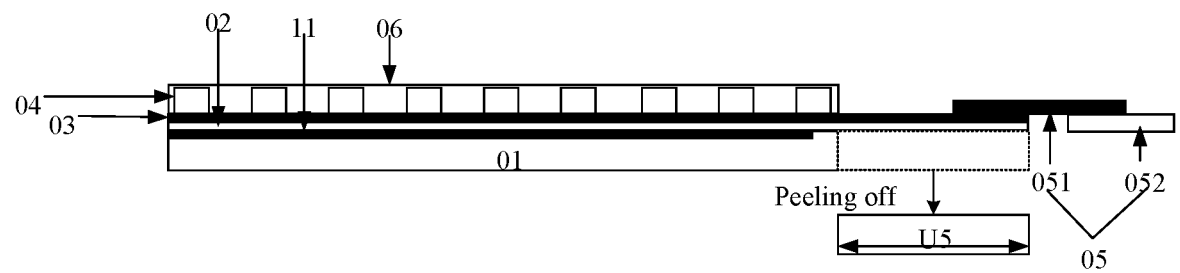

In step 3603, as shown in FIG. 44, laser may be irradiated to the initial substrate U1 from a side of the initial substrate U1 distal from the light reflecting layer 11, such that a region irradiated with the laser in the initial substrate U1 (including the abovementioned partial region U5) is separated from the organic material layer 02. Because the light reflecting layer 11 can reflect the laser (for example, the reflectivity of the laser may be greater than 80%, or 90%, or the like), and prevent the laser from transmitting through, a region covered by the light reflecting layer 11 in the initial substrate U1 is not separated from the organic material layer 02. Then, as shown in FIG. 45, the edge of the partial region U5 on the initial substrate U1 may be cut. Finally, as shown in FIG. 46, the partial region U5 is peeled off.

In practice, the initial structure formed in step 3603 further includes a light reflecting layer disposed between the base substrate and the organic material layer.

It can be seen that in the second implementation, during the irradiation with laser, since the light reflecting layer can effectively define the region irradiated by the laser in the organic material layer, there is no need to set laser emitted by a laser irradiating device, and the accuracy of laser irradiation can be made less than 1 micron.

In some embodiments, if the prepared base substrate has a chamfered structure proximal to the bending portion, the chamfered structure may be formed in the process of cutting the edge of the partial region U5 on the initial substrate U1.

Figure 47:
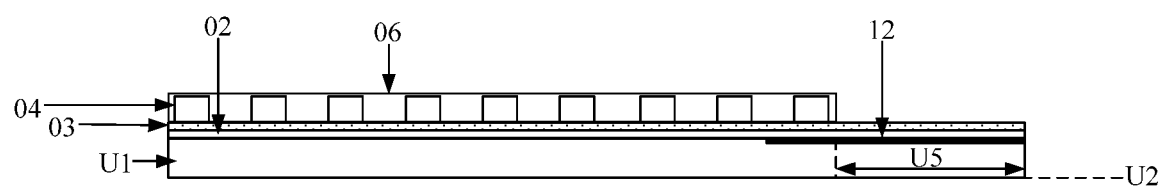

(3) Further, in step 3603, prior to forming the organic material layer on the initial substrate, as shown in FIG. 47, a dissociating layer 12 may be formed on the initial substrate U1. An orthographic projection of the partial region U5 to be removed from the initial substrate U1 on the plane U2 where the initial substrate is disposed is within an orthographic projection of the dissociating layer 12 on the plane U2 where the initial substrate is disposed; and adhesion between the dissociating layer 12 and the organic material layer 02 is less than adhesion between the initial substrate U1 and the organic material layer 02. In an exemplary embodiment, the dissociating layer 12 may be made of a polyimides material, or modified ultraviolet (UV) release adhesive or other materials. In some embodiments, the area of the orthographic projection of the partial region U5 on the plane U2 where the initial substrate is disposed may be smaller than the area of the orthographic projection of the dissociating layer 12 on the plane U2 where the initial substrate is disposed.

Figure 48:
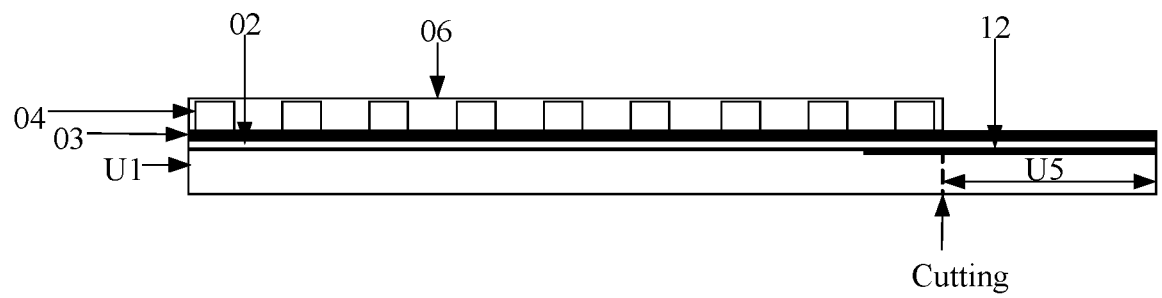
Figure 49:
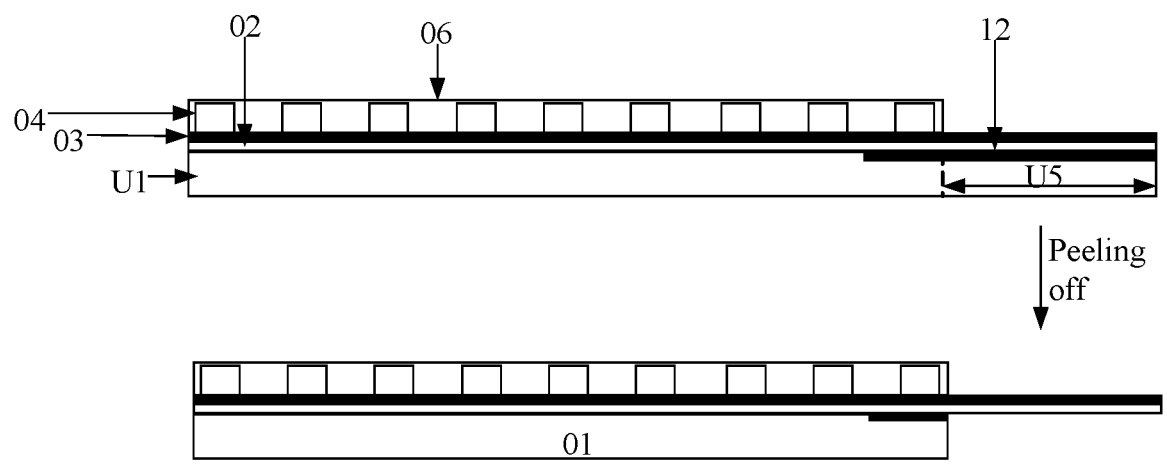

In step 3603, as shown in FIG. 48, the edge of the partial region U5 on the initial substrate U1 may be cut first. Next, as shown in FIG. 49, the partial region U5 and a portion of the dissociating layer 12 that covers the partial region U5 are peeled off. Since the abovementioned partial region U5 removed from the initial substrate U1 is the same as the region in the initial substrate U1 that is separated from the organic material layer 02, there is no need to move a cutting position outward in the process of cutting the partial region U5, which can further reduce the border width of the prepared array substrate (for example, reduce the border width by about 30 microns). In this case, the prepared array substrate may include a portion of the dissociating layer 12 that does not cover the partial region U5.

In some embodiments, if the prepared base substrate has a chamfered structure proximal to the bending portion, the chamfered structure may be formed in the process of cutting the edge of the partial region U5 on the initial substrate U1.

In some embodiments, if the prepared array substrate needs to include a binding substrate 10 as shown in FIG. 26, after the partial region in the initial substrate is removed in step 3603, both the base substrate and the binding substrate can be obtained. It can be seen that in the initial substrate, the base substrate and the binding substrate are respectively disposed on both sides of this partial region. The initial structure obtained in step 3603 may also include a binding substrate which is spaced apart from the base substrate. Two ends of the organic material layer are lapped on the base substrate and the binding substrate respectively.

Figure 50:
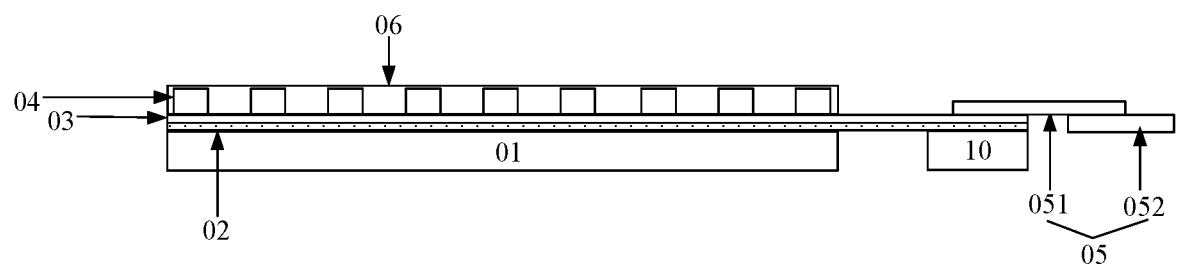
FIGS. 50 to 57 are schematic diagrams of initial structures in different embodiments according to an embodiment of the present disclosure.
Figure 51:
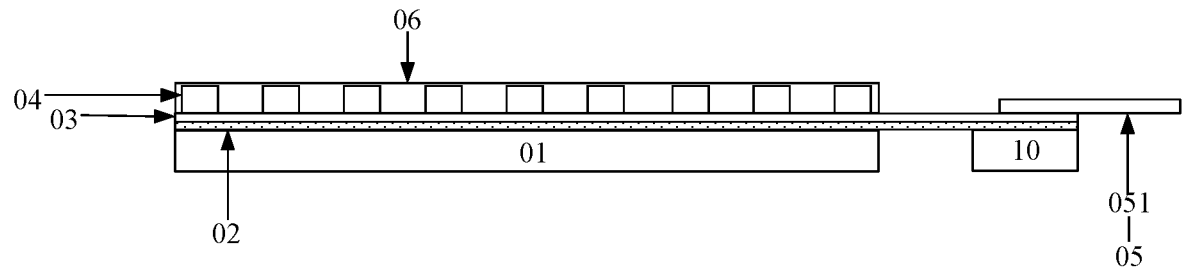
Figure 52:
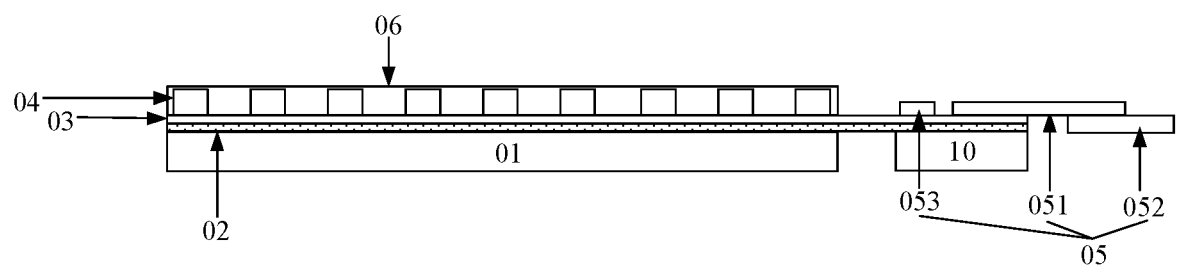
Figure 53:
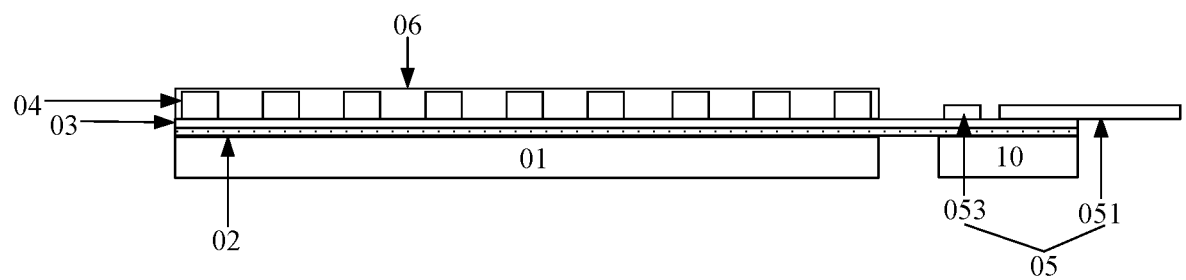
Figure 54:
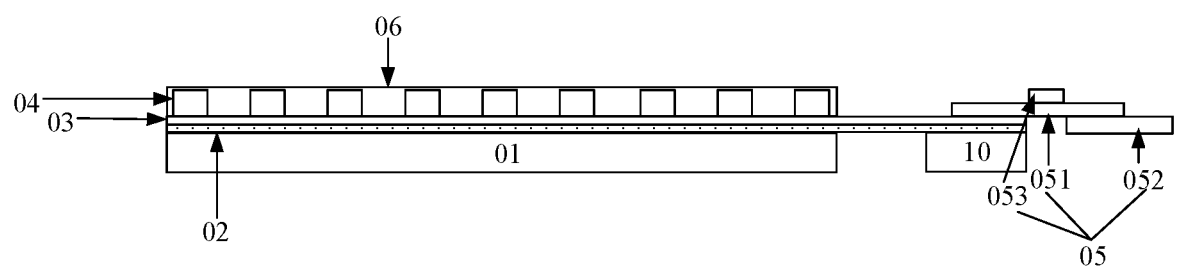
Figure 55:
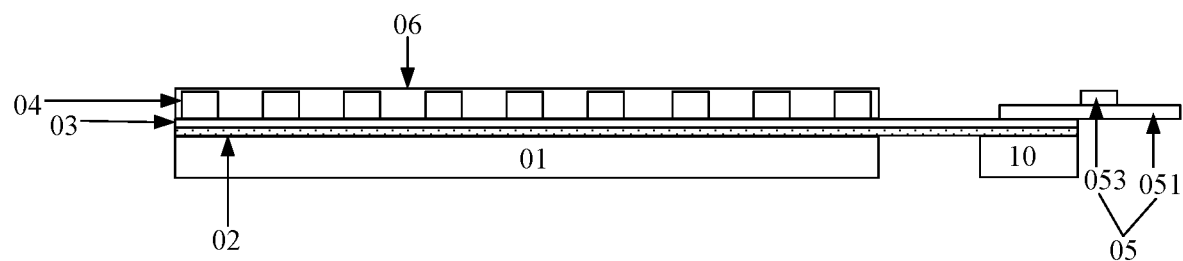
Figure 56:
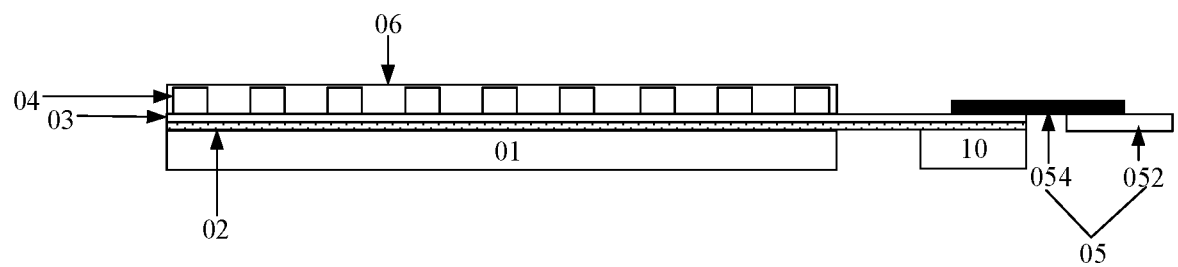
Figure 57:
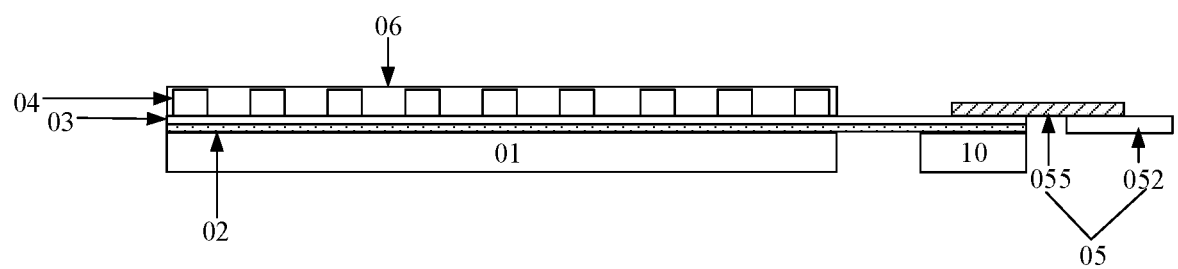

In an exemplary embodiment, when the array substrate including the control circuit shown in FIG. 10 includes an auxiliary substrate 10, the initial structure obtained in step 3603 may be as shown in FIG. 50. When the array substrate including the control circuit shown in FIG. 11 includes an auxiliary substrate 10, the initial structure obtained in step 3603 may be as shown in FIG. 51. When the array substrate including the control circuit shown in FIG. 12 includes an auxiliary substrate 10, the initial structure obtained in step 3603 may be as shown in FIG. 52. When the array substrate including the control circuit shown in FIG. 13 includes an auxiliary substrate 10, the initial structure obtained in step 3603 may be as shown in FIG. 53. When the array substrate including the control circuit shown in FIG. 14 includes an auxiliary substrate 10, the initial structure obtained in step 3603 may be as shown in FIG. 54. When the array substrate including the control circuit shown in FIG. 15 includes an auxiliary substrate 10, the initial structure obtained in step 3603 may be as shown in FIG. 55. When the array substrate including the control circuit shown in FIG. 16 includes an auxiliary substrate 10, the initial structure obtained in step 3603 may be as shown in FIG. 56. When the array substrate including the control circuit shown in FIG. 17 includes an auxiliary substrate 10, the initial structure obtained in step 3603 may be as shown in FIG. 57.

In some embodiments, if the prepared array substrate needs to include a spacer structure (such as a first spacer structure, or a first spacer structure and a second spacer structure), before step 3604, the spacer structure may be assembled on the side of the base substrate. In step 3604, the organic material layer needs to bypass the spacer structure to be bent to the second side of the base substrate.

It should be noted that in the accompanying drawings, for clarity of the illustration, the dimension of the layers and regions may be scaled up. It may be understood that when an element or layer is described as being "above" another element or layer, the described element or layer may be directly on the other element or layer, or at least one intermediate layer may be arranged between the described element or layer and the other element or layer. In addition, it may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals denote like elements.

In the present disclosure, the terms "first" and "second" are used for descriptive purposes only and are not to be construed as indicating or implying relative importance. The term "a plurality of" refers to two or more, unless specifically defined otherwise.

It should be noted that the method embodiments of the present disclosure may be cross referenced, which is not limited in the embodiments of the present disclosure. The sequence of the steps in the method embodiments of the present disclosure may be adjusted appropriately, and the steps may be deleted or added according to the situation. Within the technical scope disclosed in the present disclosure, any variations of the method easily derived by a person of ordinary skill in the art shall fall within the protection scope of the present disclosure, which is not repeated here.

Described above are merely optional embodiments of the present disclosure, and are not intended to limit the present disclosure. Within the spirit and principles of the present disclosure, any modifications, equivalent substitutions, improvements, and the like should fall within the protection scope of the present disclosure.

What is claimed is:

1. An array substrate, comprising: a base substrate, an organic material layer, a lead structure, an LED layer, and a control circuit; wherein
    the base substrate comprises a first side and a second side opposite to each other, and a third side adjacent to the first side and the second side;
    the organic material layer comprises a first planar portion, a bending portion and a second planar portion which are connected in sequence, wherein the first planar portion is disposed on the first side, the second planar portion is disposed on the second side, and the bending portion is disposed on the third side;
    the lead structure comprises a first lead portion, a bent lead portion and a second lead portion which are connected in sequence, wherein the first lead portion is disposed on a side of the first planar portion distal from the base substrate, the bent lead portion is disposed on a side of the bending portion distal from the base substrate, and the second lead portion is disposed on a side of the second planar portion distal from the base substrate;
    the LED layer is disposed on a side of the first lead portion distal from the base substrate, and is connected to the first lead portion;
    the control circuit is disposed on the second side of the base substrate and is connected to the second lead portion, and the control circuit is configured to control the LED layer to emit light; and
    the array substrate further comprises a binding substrate disposed between the base substrate and the second planar portion, wherein the binding substrate comprises an opening portion extending through the binding substrate in a thickness direction of the binding substrate, at lease a part of the control circuit is in the opening portion.

2. The array substrate according to claim 1, wherein the control circuit comprises a flexible printed circuit (FPC) and a PCB (printed circuit board), and
    the FPC is at one side of the second lead portion distal from the base substrate, and is connected with the second lead portion and the PCB.

3. The array substrate according to claim 1, wherein the control circuit comprises a flexible printed circuit (FPC), and
    the FPC is at one side of the second lead portion distal from the base substrate, and is connected with the second lead portion.

4. The array substrate according to claim 1, wherein the control circuit comprises a flexible printed circuit (FPC), a PCB (printed circuit board) and a chip,
    the FPC is at one side of the second lead portion distal from the base substrate, and is connected with the second lead portion and the PCB, and
    the chip is at one side of the second lead portion distal from the base substrate, and is connected with the second lead portion, and the chip and the FPC are in a same layer.

5. The array substrate according to claim 1, wherein the control circuit comprises a flexible printed circuit (FPC) and a chip, the FPC is at one side of the second lead portion distal from the base substrate, and is connected with the second lead portion, and the chip is at one side of the second lead portion distal from the base substrate and is connected with the second lead portion, and the chip and the FPC are in a same layer.

6. The array substrate according to claim 1, wherein the control circuit comprises a flexible printed circuit (FPC), a PCB (printed circuit board) and a chip, the FPC is at one side of the second lead portion distal from the base substrate, and the chip is at one side of the FPC distal from the base substrate, and the FPC is connect with the second lead portion, the PCB and the chip.

7. The array substrate according to claim 1, wherein the control circuit comprises a flexible printed circuit (FPC) and a chip, the FPC is at one side of the second lead portion distal from the base substrate, and the chip is at one side of the FPC distal from the base substrate and the FPC is connect with the second lead portion and the chip.

8. The array substrate according to claim 1, wherein the control circuit comprises a PCB (printed circuit board), and any one of a connector and a terminal, and any one of the connector and the terminal is at one side of the second lead portion distal from the base substrate, and is connected with the second lead portion and the PCB.

9. The array substrate according to claim 1, wherein the array substrate comprises an adhesive disposed between the base substrate and the control circuit.

10. The array substrate according to claim 1, wherein the control circuit comprises a PCB (printed circuit board), and the PCB is in the opening portion.

11. The array substrate according to claim 10, wherein a distance between a side of the PCB distal from the base substrate and the base substrate is smaller than a distance between a side of the second lead portion distal from the base substrate and the base substrate.

12. The array substrate according to claim 10, wherein the control circuit comprises a flexible printed circuit (FPC), and the FPC comprises a first end and a second end, the first end is connected with a side of the second lead portion distal from the base substrate, and the second end is connected with a side of the PCB distal from the base substrate.

13. The array substrate according to claim 1, further comprising a light reflecting layer, wherein the light reflecting layer comprises a second light reflecting portion disposed between the binding substrate and the second planar portion.

14. The array substrate according to claim 13, wherein the light reflecting layer comprises a first light reflecting portion disposed between the base substrate and the first planar portion, a distance between the first light reflecting portion and the bending portion is greater than 0, and a distance between the second light reflecting portion and the bending portion is greater than 0.

15. A display device, which comprises the array substrate according to claim 1, and a plurality of the array substrates which are spliced with each other;

wherein an LED layer in the array substrate comprises a plurality of LEDs disposed on the first planar portion, and a distance between centers of any two LEDs in the plurality of LEDs is P; and in any two adjacent array substrates in the display device, the distance between the centers of the closest two LEDs is Q, and P=Q.

* * * * *